United States Patent
Nakamura et al.

(10) Patent No.: US 11,415,888 B2
(45) Date of Patent: Aug. 16, 2022

(54) NEGATIVE TYPE PHOTOSENSITIVE RESIN COMPOSITION, PHOTOSENSITIVE RESIST FILM, PATTERN FORMING METHOD, CURED FILM, AND METHOD OF PRODUCING CURED FILM

(71) Applicant: TOKYO OHKA KOGYO CO., LTD., Kawasaki (JP)

(72) Inventors: Ryosuke Nakamura, Kawasaki (JP); Tomoyuki Ando, Kawasaki (JP); Tokunori Yamadaya, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 318 days.

(21) Appl. No.: 16/326,865

(22) PCT Filed: Aug. 28, 2017

(86) PCT No.: PCT/JP2017/030721
§ 371 (c)(1),
(2) Date: Feb. 20, 2019

(87) PCT Pub. No.: WO2018/043395
PCT Pub. Date: Mar. 8, 2018

(65) Prior Publication Data
US 2019/0235380 A1 Aug. 1, 2019

(30) Foreign Application Priority Data
Aug. 31, 2016 (JP) .............................. JP2016-170206

(51) Int. Cl.
*G03F 7/038* (2006.01)
*G03F 7/11* (2006.01)
*G03F 7/38* (2006.01)
*G03F 7/004* (2006.01)
*C08K 5/55* (2006.01)
*C08K 5/49* (2006.01)
*C08K 3/22* (2006.01)
*C08L 63/00* (2006.01)
*C09D 163/00* (2006.01)
*C09D 163/04* (2006.01)
*G03F 7/16* (2006.01)
(Continued)

(52) U.S. Cl.
CPC .............. *G03F 7/038* (2013.01); *C08K 3/22* (2013.01); *C08K 5/49* (2013.01); *C08K 5/55* (2013.01); *C08L 63/00* (2013.01); *C09D 163/00* (2013.01); *C09D 163/04* (2013.01); *G03F 7/0045* (2013.01); *G03F 7/0047* (2013.01); *G03F 7/0385* (2013.01); *G03F 7/11* (2013.01); *G03F 7/16* (2013.01); *G03F 7/168* (2013.01); *G03F 7/2004* (2013.01); *G03F 7/325* (2013.01); *G03F 7/38* (2013.01); *G03F 7/40* (2013.01)

(58) Field of Classification Search
CPC .......... G03F 7/038; G03F 7/0385; G03F 7/11; G03F 7/38
See application file for complete search history.

(56) References Cited

U.S. PATENT DOCUMENTS 8,617,787 B2 * 12/2013 Suzuki ................ C08G 59/687
430/270.1
2005/0040562 A1 2/2005 Steinmann et al.
(Continued)

FOREIGN PATENT DOCUMENTS

JP 10-097070 A 4/1998
JP 2000-122287 A 4/2000
(Continued)

OTHER PUBLICATIONS

Third Party Observation in Japanese Patent Application No. 2016-170206, mailed Oct. 27, 2020.
International Search Report in International Application No. PCT/JP2017/030721, dated Oct. 31, 2017.
Office Action issued in Taiwanese Patent Application No. 106129272, dated Nov. 20, 2020.
Notification (Information Statement) in Japanese Patent Application No. 2016-170206 dated Jun. 15, 2021.
Office Action in Taiwanese Patent Application No. 106129272 dated Jun. 22, 2021.

*Primary Examiner* — John S Chu
(74) *Attorney, Agent, or Firm* — Knobbe, Martens, Olson & Bear LLP

(57) ABSTRACT

A negative type photosensitive resin composition containing an epoxy group-containing resin; a metal oxide; and a cationic polymerization initiator (I). The cationic polymerization initiator (I) contains one or more of a compound represented by Formula (I1) and a compound represented by Formula (I2). In Formula (I1), $R^{b01}$ to $R^{b04}$ represent an aryl group which may have a substituent or a fluorine atom. In Formula (I2), $R^{b05}$ represents a fluorinated alkyl group which may have a substituent or a fluorine atom. A plurality of $R^{b05}$'s may be the same as or different from one another. q represents an integer of 1 or greater, and $Q^{q+}$'s each independently represent a q-valent organic cation.

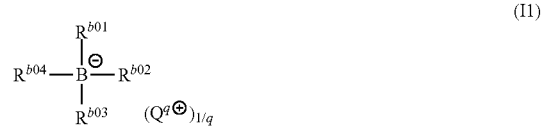

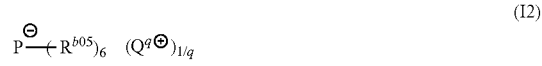

13 Claims, No Drawings

(51) Int. Cl.
*G03F 7/20* (2006.01)
*G03F 7/32* (2006.01)
*G03F 7/40* (2006.01)

(56) References Cited

U.S. PATENT DOCUMENTS

| | | | |
|---|---|---|---|
| 2012/0250268 A1 | 10/2012 | Ito et al. | |
| 2012/0326194 A1* | 12/2012 | Son | H01L 51/5259 257/98 |
| 2013/0076458 A1 | 3/2013 | Katou et al. | |
| 2013/0108961 A1 | 5/2013 | Oonishi et al. | |
| 2013/0158167 A1* | 6/2013 | Takenaka | C08G 59/24 523/456 |
| 2014/0329926 A1* | 11/2014 | Kirino | C08G 59/66 522/14 |
| 2015/0376445 A1* | 12/2015 | Nakamura | C08L 63/00 523/427 |
| 2016/0126431 A1* | 5/2016 | Marukawa | C08G 59/24 257/100 |
| 2016/0334701 A1 | 11/2016 | Fujikawa et al. | |
| 2018/0138027 A1* | 5/2018 | Oku | H01J 61/44 |
| 2020/0199372 A1* | 6/2020 | Egawa | C09D 4/06 |

FOREIGN PATENT DOCUMENTS

| | | |
|---|---|---|
| JP | 2000-347403 A | 12/2000 |
| JP | 2005-250067 A | 9/2005 |
| JP | 2007-291263 A | 11/2007 |
| JP | 2008-250200 A | 10/2008 |
| JP | 2009-092761 A | 4/2009 |
| JP | 2010-007049 A | 1/2010 |
| JP | 2010-018717 A | 1/2010 |
| JP | 2012-241036 A | 12/2012 |
| JP | 2014-215440 A | 11/2014 |
| JP | 2015-187750 A | 10/2015 |
| TW | 200813625 A | 3/2008 |
| TW | 201009497 A | 3/2010 |
| TW | 201136965 A | 11/2011 |
| TW | 201300484 A | 1/2013 |
| WO | WO 2008/007764 A1 | 1/2008 |
| WO | WO 2009/151050 A1 | 12/2009 |
| WO | WO 2010/140527 A1 | 12/2010 |
| WO | WO 2012/008472 A1 | 1/2012 |
| WO | WO 2013/122208 A1 | 8/2013 |
| WO | WO 2015/019512 A1 | 2/2015 |
| WO | WO 2015/115128 A1 | 8/2015 |
| WO | WO 2016/031602 A1 | 3/2016 |

* cited by examiner

NEGATIVE TYPE PHOTOSENSITIVE RESIN COMPOSITION, PHOTOSENSITIVE RESIST FILM, PATTERN FORMING METHOD, CURED FILM, AND METHOD OF PRODUCING CURED FILM

This application is the U.S. National Phase under 35 U.S.C. § 371 of International Application PCT/JP2017/030721, filed Aug. 28, 2017, designating the U.S., and published in Japanese as WO 2018/043395 on Mar. 8, 2018 which claims priority to Japanese Patent Application No. 2016-170206, filed Aug. 31, 2016, the entire content of which is incorporated herein by reference.

TECHNICAL FIELD

The present invention relates to a negative type photosensitive resin composition, a photosensitive resist film having a photosensitive resin film formed by using the negative type photosensitive resin composition, a pattern forming method, a cured film, and a method of producing the cured film.

Priority is claimed on Japanese Patent Application No. 2016-170206, filed on Aug. 31, 2016, the content of which is incorporated herein by reference.

BACKGROUND ART

In recent years, with miniaturization and densification of electronic components, there has been an increasing demand for a photosensitive resin composition used for an electronic component having a hollow sealing structure, such as a surface acoustic wave (SAW) filter. In formation of the hollow sealing structure of such an electronic component, it is necessary to reduce the thickness of a cured film formed by curing a photosensitive resin composition and to strengthen the cured film.

Further, a photosensitive resin composition is used for a spacer between a semiconductor wafer and a transparent substrate. For example, a spacer is obtained, using a negative photosensitive resin composition, by forming a photosensitive resin film on a surface of a semiconductor wafer or the like, performing selective exposure on the photosensitive resin film to radiation such as light or electronic beams, performing a development treatment to form a pattern, and pressure-bonding the pattern to a transparent substrate (for example, a glass substrate). In this photosensitive resin composition, it is necessary to perform patterning in an excellent shape without residues during the development treatment according to a photolithography method.

In the related art, a photosensitive resin composition that contains a polyfunctional epoxy resin, a cationic polymerization initiator, a solvent, and a surfactant is disclosed as a photosensitive material forming the photosensitive resin film (see PTL 1).

CITATION LIST

Patent Literature

[PTL 1] Japanese Unexamined Patent Application, First Publication No. 2008-250200

SUMMARY OF INVENTION

Technical Problem

However, in a case where the thickness of the cured film is reduced using the photosensitive resin composition described in PTL 1 and miniaturization of the hollow sealing structure is attempted, the hardness of the cured thin film against a processing pressure under a high temperature (150° C. to 200° C.) condition during molding is insufficient, and thus it is difficult to maintain the hollow sealing structure.

The present invention has been made in consideration of the above-described problems, and an object thereof is to provide a negative type photosensitive resin composition from which a cured film having improved hardness can be obtained and a pattern having an excellent shape can be formed; a photosensitive resist film which has a photosensitive resin film formed by using the negative type photosensitive resin composition; a pattern forming method; a cured film; and a method of producing the cured film.

Solution to Problem

According to a first aspect of the present invention, there is provided a negative type photosensitive resin composition containing: an epoxy group-containing resin (A); a metal oxide (M); and a cationic polymerization initiator (I), the cationic polymerization initiator (I) containing one or more selected from the group consisting of a compound represented by Formula (I1) and a compound represented by Formula (I2).

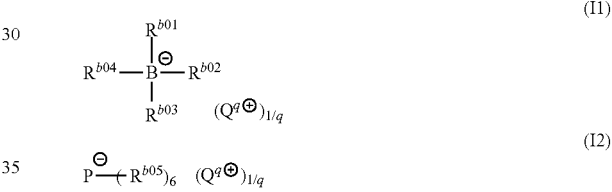

[In the formulae, $R^{b01}$ to $R^{04}$ each independently represent an aryl group which may have a substituent or a fluorine atom. $R^{b05}$ represents a fluorinated alkyl group which may have a substituent or a fluorine atom. A plurality of $R^{b05}$'s may be the same as or different from one another. q represents an integer of 1 or greater, and $Q^{q+}$'s each independently represent a q-valent organic cation.]

According to a second aspect of the present invention, there is provided a photosensitive resist film which is obtained by laminating a base film, a photosensitive resin film formed using the negative type photosensitive resin composition according to the first aspect, and a cover film in that order.

According to a third aspect of the present invention, there is provided a pattern forming method including: a step of forming a photosensitive resin film on a support using the negative type photosensitive resin composition according to the first aspect or the photosensitive resist film according to the second aspect; a step of exposing the photosensitive resin film; and a step of developing the exposed photosensitive resin film to form a negative type pattern.

According to a fourth aspect of the present invention, there is provided a cured film which is obtained by curing the negative type photosensitive resin composition according to the first aspect.

According to a fifth aspect of the present invention, there is provided a method of producing a cured film, including: a step of forming a photosensitive resin film on a support using the negative type photosensitive resin composition according to the first aspect or the photosensitive resist film according to the second aspect; and a step of curing the photosensitive resin film to obtain a cured film.

Advantageous Effects of Invention

According to the present invention, it is possible to obtain a cured film with improved hardness and to provide a negative type photosensitive resin composition which is capable of forming a pattern having an excellent shape, a photosensitive resist film which has a photosensitive resin film formed by using the negative type photosensitive resin composition, a pattern forming method, a cured film, and a method of producing the cured film.

DESCRIPTION OF EMBODIMENTS

In the present description and claims, the term "aliphatic" is a relative concept used with respect to the term "aromatic" and defines a group with no aromaticity or a compound with no aromaticity.

The term "alkyl group" includes linear, branched, or cyclic monovalent saturated hydrocarbon groups unless otherwise specified. The same applies to the alkyl group in an alkoxy group.

The term "alkylene group" includes linear, branched, or cyclic divalent saturated hydrocarbon groups unless otherwise specified.

A "halogenated alkyl group" is a group in which part or all of the hydrogen atoms in an alkyl group are substituted with halogen atoms. Examples of the halogen atom include a fluorine atom, a chlorine atom, a bromine atom, and an iodine atom.

A "fluorinated alkyl group" or a "fluorinated alkylene group" is a group in which part or all of the hydrogen atoms in an alkyl group or alkylene group have been substituted with fluorine atoms.

The term "constitutional unit" indicates a monomer unit constituting a polymer compound (a resin, a polymer, or a copolymer).

The expression "may have a substituent" includes a case where a hydrogen atom (—H) is substituted with a monovalent group and a case where a methylene (—CH$_2$—) group is substituted with a divalent group.

The term "exposure" is used as a general concept for irradiation with radiation.

(Negative Type Photosensitive Resin Composition)

A negative type photosensitive resin composition (hereinafter, also simply referred to as a "photosensitive composition") according to the present embodiment contains an epoxy group-containing resin (A); a metal oxide (M); and a cationic polymerization initiator (I). Hereinafter, these components are referred to as a component (A), a component (M), and a component (I).

In a case where a photosensitive resin film is formed using such a photosensitive composition and selective exposure is performed on the photosensitive resin film, since a cation moiety of the component (I) is decomposed to generate an acid in an exposed portion of the photosensitive resin film, and an epoxy group in the component (A) is subjected to ring-opening polymerization due to an action of the acid so that the solubility of the component (A) in a developing solution is decreased while the solubility of the component (A) in a developing solution is not changed in an unexposed portion of the photosensitive resin film, a difference between the solubility of the exposed portion of the photosensitive resin film in a developing solution and the unexposed portion thereof in a developing solution is generated. Therefore, in a case where the photosensitive resin film is developed, an unexposed portion is dissolved and removed so that a negative type pattern is formed.

<Epoxy Group-Containing Resin (A)>

The epoxy group-containing resin (component (A)) is not particularly limited as long as the resin contains an epoxy group sufficient to form a pattern upon exposure, in one molecule.

Examples of the component (A) include a novolak type epoxy resin (Anv), a bisphenol A type epoxy resin (Abp), a bisphenol F type epoxy resin, an aliphatic epoxy resin, and an acrylic resin (Aac).

<<Novolak Type Epoxy Resin (Anv)>>

Suitable examples of the novolak type epoxy resin (Anv) include a resin (hereinafter, also referred to as a "component (A1)") represented by Formula (A1).

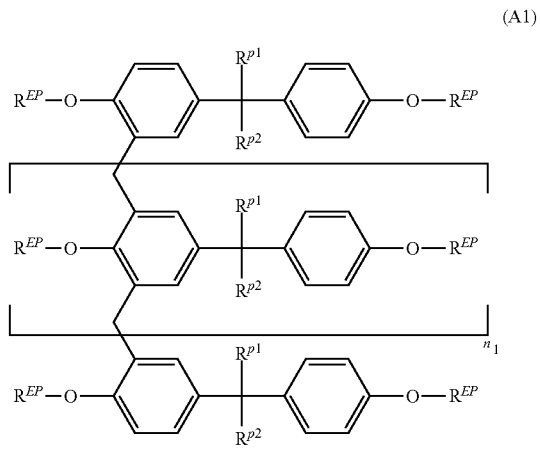

(A1)

[In the formula, $R^{p1}$ and $R^{p2}$ each independently represent a hydrogen atom or an alkyl group having 1 to 5 carbon atoms. A plurality of $R^{p1}$'s may be the same as or different from one another. A plurality of $R^{p2}$'s may be the same as or different from one another. $n_1$ represents an integer of 1 to 5. $R^{EP}$ represents an epoxy group-containing group. A plurality of $R^{EP}$'s may be the same as or different from one another.]

In Formula (A1), the alkyl group having 1 to 5 carbon atoms as $R^{p1}$ and $R^{p2}$ is, for example, a linear, branched, or cyclic alkyl group having 1 to 5 carbon atoms. Examples of the linear or branched alkyl group include a methyl group, an ethyl group, a propyl group, an isopropyl group, an n-butyl group, an isobutyl group, a tert-butyl group, a pentyl group, an isopentyl group, and a neopentyl group. Further, examples of the cyclic alkyl group include a cyclobutyl group and a cyclopentyl group.

Among the examples, $R^{p1}$ and $R^{p2}$ represent preferably a hydrogen atom or a linear or branched alkyl group, more preferably a hydrogen atom or a linear alkyl group, and particularly preferably a hydrogen atom or a methyl group.

In Formula (A1), a plurality of $R^{p1}$'s may be the same as or different from one another. A plurality of $R^{p2}$'s may be the same as or different from one another.

In Formula (A1), $R^{EP}$ represents an integer of 1 to 5, preferably 2 or 3, and more preferably 2.

In Formula (A1), $R^{EP}$ represents an epoxy group-containing group.

The epoxy group-containing group of $R^{EP}$ is not particularly limited, and examples thereof include a group formed of only an epoxy group; a group formed of only an alicyclic epoxy group; and a group containing an epoxy group or an alicyclic epoxy group and a divalent linking group.

The alicyclic epoxy group is an alicyclic group having an oxacyclopropane structure as a 3-membered ring ether. Specifically, the alicyclic epoxy group is a group having an alicyclic group and an oxacyclopropane structure.

The alicyclic group which becomes a basic skeleton of an alicyclic epoxy group may be monocyclic or polycyclic. Examples of the monocyclic alicyclic group include a cyclopropyl group, a cyclobutyl group, a cyclopentyl group, a cyclohexyl group, a cycloheptyl group, and a cyclooctyl group. Further, examples of the polycyclic alicyclic group include a norbornyl group, an isobornyl group, a tricyclononyl group, a tricyclodecyl group, and a tetracyclododecyl group. Further, hydrogen atoms in these alicyclic groups may be substituted with an alkyl group, an alkoxy group, a hydroxyl group, and the like.

In a case of the group containing an epoxy group or an alicyclic epoxy group and a divalent linking group, it is preferable that an epoxy group or an alicyclic epoxy group be bonded through a divalent linking group bonded to an oxygen atom (—O—) in Formula (A1).

Here, the divalent linking group is not particularly limited, and suitable examples thereof include a divalent hydrocarbon group which may have a substituent and a divalent linking group having hetero atoms.

In regard to a divalent hydrocarbon group which may have a substituent:

Such a divalent hydrocarbon group may be an aliphatic hydrocarbon group or an aromatic hydrocarbon group.

The aliphatic hydrocarbon group in the divalent hydrocarbon group may be saturated or unsaturated. In general, it is preferable that the aliphatic hydrocarbon group be saturated.

More specific examples of the aliphatic hydrocarbon group include a linear or branched aliphatic hydrocarbon group and an aliphatic hydrocarbon group containing a ring in the structure thereof.

The number of carbon atoms in the linear aliphatic hydrocarbon group is preferably in a range of 1 to 10, more preferably in a range of 1 to 6, still more preferably in a range of 1 to 4, and most preferably in a range of 1 to 3. As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

The number of carbon atoms of the branched aliphatic hydrocarbon group is preferably in a range of 2 to 10, more preferably in a range of 2 to 6, still more preferably in a range of 2 to 4, and most preferably 2 or 3.

As the branched aliphatic hydrocarbon group, a branched alkylene group is preferable, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$— and —$CH_2CH(CH_3)CH_2$—; and alkyltetramethylene groups such as —$CH(CH_3)CH_2CH_2CH_2$— and —$CH_2CH(CH_3)CH_2CH_2$—. As the alkyl group in the alkylalkylene group, a linear alkyl group having 1 to 5 carbon atoms is preferable.

Examples of the aliphatic hydrocarbon group containing a ring in the structure thereof include an alicyclic hydrocarbon group (a group formed by removing two hydrogen atoms from an aliphatic hydrocarbon ring), a group in which an alicyclic hydrocarbon group is bonded to the terminal of a linear or branched aliphatic hydrocarbon group, and a group in which an alicyclic hydrocarbon group is interposed in a linear or branched aliphatic hydrocarbon group. Examples of the linear or branched aliphatic hydrocarbon group are the same as those described above.

The number of carbon atoms in the alicyclic hydrocarbon group is preferably in a range of 3 to 20 and more preferably in a range of 3 to 12.

The alicyclic hydrocarbon group may be a monocyclic group or a polycyclic group. As the monocyclic alicyclic hydrocarbon group, a group formed by removing two hydrogen atoms from a monocycloalkane is preferable. The number of carbon atoms of the monocycloalkane is preferably in a range of 3 to 6, and specific examples of such a monocycloalkane include cyclopentane and cyclohexane.

As the polycyclic alicyclic hydrocarbon group, a group formed by removing two hydrogen atoms from a polycycloalkane is preferable. The number of carbon atoms of the polycycloalkane is preferably in a range of 7 to 12, and specific examples of such a polycycloalkane include adamantane, norbornane, isobornane, tricyclodecane, and tetracyclododecane.

The aromatic hydrocarbon group in a divalent hydrocarbon group is a hydrocarbon group having at least one aromatic ring. The aromatic ring is not particularly limited as long as the aromatic ring has a cyclic conjugated system having $(4n+2)\pi$ electrons, and may be monocyclic or polycyclic. The number of carbon atoms in the aromatic ring is preferably in a range of 5 to 30, more preferably in a range of 5 to 20, still more preferably in a range of 6 to 15, and particularly preferably in a range of 6 to 12. Examples of the aromatic ring include an aromatic hydrocarbon ring such as benzene, naphthalene, anthracene, or phenanthrene; and an aromatic hetero ring in which part of the carbon atoms constituting the aromatic hydrocarbon ring have been substituted with hetero atoms. Examples of the hetero atoms in the aromatic hetero ring include an oxygen atom, a sulfur atom, and a nitrogen atom. Specific examples of the aromatic hetero ring include a pyridine ring and a thiophene ring.

Specific examples of the aromatic hydrocarbon group include a group (an arylene group or a heteroarylene group) formed by removing two hydrogen atoms from the aromatic hydrocarbon ring or aromatic hetero ring; a group formed by removing two hydrogen atoms from an aromatic compound (biphenyl, fluorene or the like) having two or more aromatic rings; and a group (a group in which one hydrogen atom has been further removed from the aryl group in the above-described arylalkyl group such as a benzyl group, a phenethyl group, a 1-naphthylmethyl group, a 2-naphthylmethyl group, a 1-naphthylethyl group, or a 2-naphthylethyl group) in which one hydrogen atom of a group (an aryl group or a heteroaryl group) formed by removing one hydrogen atom from the aromatic hydrocarbon ring or aromatic hetero ring has been substituted with an alkylene group. The number of carbon atoms in the alkylene group which is bonded to the above-described aryl group or heteroaryl group is preferably in a range of 1 to 4, more preferably 1 or 2, and particularly preferably 1 carbon atom.

The divalent hydrocarbon group may have a substituent.

The linear or branched aliphatic hydrocarbon group serving as a divalent hydrocarbon group may or may not have a substituent. Examples of the substituent include a fluorine atom, a fluorinated alkyl group having 1 to 5 carbon atoms which has been substituted with a fluorine atom, and a carbonyl group.

The alicyclic hydrocarbon group in an aliphatic hydrocarbon group having a ring in the structure thereof, as the divalent hydrocarbon group, may or may not have a substituent. Examples of the substituent include an alkyl group, an alkoxy group, a halogen atom, a halogenated alkyl group, a hydroxyl group, and a carbonyl group.

As the alkyl group serving as the substituent, an alkyl group having 1 to 5 carbon atoms is preferable, and a methyl group, an ethyl group, a propyl group, an n-butyl group, or a tert-butyl group is most preferable.

As the alkoxy group serving as the substituent, an alkoxy group having 1 to 5 carbon atoms is preferable, a methoxy group, an ethoxy group, an n-propoxy group, an iso-propoxy group, an n-butoxy group, or a tert-butoxy group is preferable, and a methoxy group or an ethoxy group is most preferable.

Examples of the halogen atom serving as the substituent include a fluorine atom, a chlorine atom, a bromine atom, and an iodine atom. Among these, a fluorine atom is preferable.

Examples of the halogenated alkyl group serving as the substituent include a group in which part or all of the hydrogen atoms in the alkyl group have been substituted with halogen atoms.

In the alicyclic hydrocarbon group, part of the carbon atoms constituting the ring structure thereof may be substituted with a substituent containing a hetero atom. As the substituent containing a hetero atom, —O—, —C(=O)—O—, —S—, —S(=O)$_2$—, or —S(=O)$_2$—O— is preferable.

In the aromatic hydrocarbon group serving as a divalent hydrocarbon group, a hydrogen atom in the aromatic hydrocarbon group may be substituted with a substituent. For example, the hydrogen atom bonded to the aromatic ring in the aromatic hydrocarbon group may be substituted with a substituent. Examples of the substituent include an alkyl group, an alkoxy group, a halogen atom, a halogenated alkyl group, and a hydroxyl group.

As the alkyl group serving as the substituent, an alkyl group having 1 to 5 carbon atoms is preferable, and a methyl group, an ethyl group, a propyl group, an n-butyl group, or a tert-butyl group is most preferable.

Examples of the alkoxy group, the halogen atom, and the halogenated alkyl group serving as the substituents are the same as those exemplified as the substituents for substituting a hydrogen atom in the alicyclic hydrocarbon group.

In regard to divalent linking group having hetero atom:

The hetero atom in the divalent linking group having a hetero atom is an atom other than a carbon atom and a hydrogen atom, and examples thereof include an oxygen atom, a nitrogen atom, a sulfur atom, and a halogen atom.

In the examples of the divalent linking group having a heteroatom, preferred examples of the linking group include —O—, —C(=O)—O—, —C(=O)—, or —O—C(=O)—O—; —C(=O)—NH—, —NH—, —NH—C(=O)—O—, or —NH—C(=NH)— (H may be substituted with a substituent such as an alkyl group, an acyl group, or the like); —S—, —S(=O)$_2$—, —S(=O)$_2$—O—, and a group represented by Formula —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m''}$—Y$^{22}$—, or —Y$^{21}$—O—C(=O)—Y$^{22}$— [in the formulae, Y$^{21}$ and Y$^{22}$ each independently represent a divalent hydrocarbon group which may have a substituent, O represents an oxygen atom, and m" represents an integer of 0 to 3].

In a case where the divalent linking group containing a hetero atom is —C(=O)—NH—, —NH—, —NH—C(=O)—O—, or —NH—C(=NH)—, H may be substituted with a substituent such as an alkyl group, an acyl group, or the like. The substituent (an alkyl group, an acyl group, or the like) preferably has 1 to 10 carbon atoms, more preferably 1 to 8 carbon atoms, and particularly preferably 1 to 5 carbon atoms.

In Formulae —Y$^{21}$—O—Y$^{22}$—, —Y$^{21}$—O—, —Y$^{21}$—C(=O)—O—, —C(=)—O—Y$^{21}$—, —[Y$^{21}$—C(=O)—O]$_{m''}$—Y$^{22}$—, or —Y$^{21}$—O—C(=O)—Y$^{22}$—, Y$^{21}$ and Y$^{22}$ each independently represent a divalent hydrocarbon group which may have a substituent. Examples of the divalent hydrocarbon group include the same groups as those described above as the "divalent hydrocarbon group which may have a substituent" in the explanation of the above-described divalent linking group.

As Y$^{21}$, a linear aliphatic hydrocarbon group is preferable, a linear alkylene group is more preferable, a linear alkylene group having 1 to 5 carbon atoms is still more preferable, and a methylene group or an ethylene group is particularly preferable.

As Y$^{22}$, a linear or branched aliphatic hydrocarbon group is preferable, and a methylene group, an ethylene group, or an alkylmethylene group is more preferable. The alkyl group in the alkylmethylene group is preferably a linear alkyl group having 1 to 5 carbon atoms, more preferably a linear alkyl group having 1 to 3 carbon atoms, and most preferably a methyl group.

In the group represented by Formula —[Y$^{21}$—C(=O)—O]$_{m''}$—Y$^{22}$—, m" represents an integer of 0 to 3, preferably an integer of 0 to 2, more preferably 0 or 1, and particularly preferably 1. In other words, it is particularly preferable that the group represented by Formula —[Y$^{21}$—C(=O)—O]$_{m''}$—Y$^{22}$— be a group represented by Formula —Y$^{21}$—C(=O)—O—Y$^{22}$—. Among these, a group represented by Formula —(CH$_2$)$_{a'}$—C(=O)—O—(CH$_2$)$_{b'}$— is preferable. In the formula, a' represents an integer of 1 to 10, preferably an integer of 1 to 8, more preferably an integer of 1 to 5, still more preferably 1 or 2, and most preferably 1. b' represents an integer of 1 to 10, preferably an integer of 1 to 8, more preferably an integer of 1 to 5, still more preferably 1 or 2, and most preferably 1.

Among these, a glycidyl group is preferable as the epoxy group-containing group represented by R$^{EP}$.

Further, suitable examples of the novolak type epoxy resin (Anv) include a resin having a constitutional unit represented by Formula (anv1).

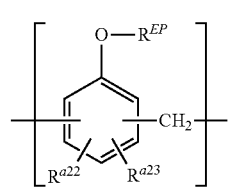

(anv1)

[In the formula, R$^{EP}$ represents an epoxy group-containing group, and R$^{a22}$ and R$^{a23}$ each independently represent a hydrogen atom, an alkyl group having 1 to 5 carbon atoms, or a halogen atom.]

In Formula (anv1), the alkyl group having 1 to 5 carbon atoms of $R^{a22}$ and $R^{a23}$ has the same definition as that for the alkyl group having 1 to 5 carbon atoms of $R^{p1}$ and $R^{p2}$ in Formula (A1). It is preferable that the halogen atom of $R^{a22}$ and $R^{a23}$ be a chlorine atom or a bromine atom.

In Formula (anv1), $R^{EP}$ has the same definition as that for $R^{EP}$ in Formula (A1), and it is preferable that $R^{EP}$ represent a glycidyl group.

Specific examples of the constitutional unit represented by Formula (anv1) are shown below.

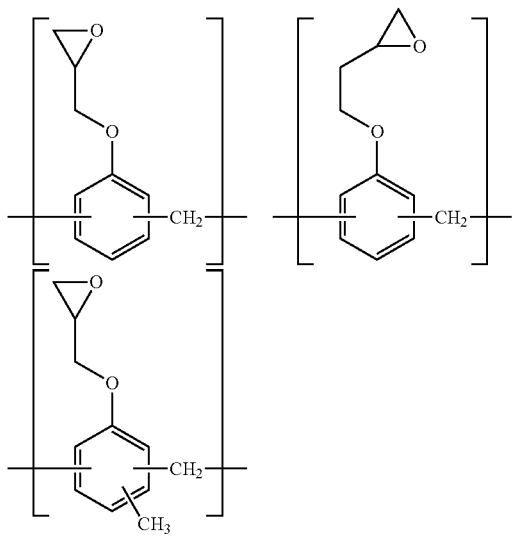

The novolak type epoxy resin (Anv) may be a resin formed of only the constitutional unit (anv1) or a resin having the constitutional unit (anv1) and other constitutional units.

Examples of other constitutional units include constitutional units represented by Formulae (anv2) and (anv3).

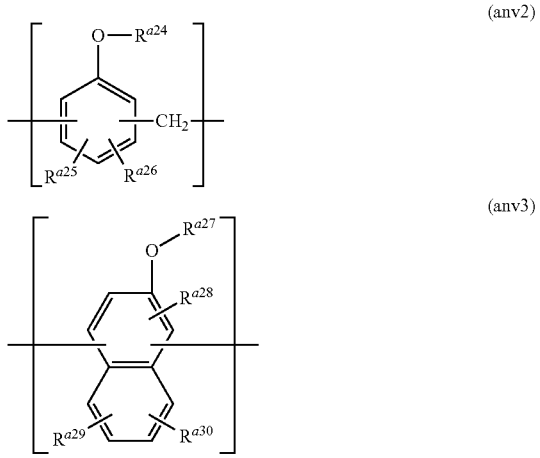

[In Formulae, $R^{a24}$ represents a hydrocarbon group which may have a substituent. $R^{a25}$ and $R^{a26}$ and $R^{a28}$ to $R^{a30}$ each independently represent a hydrogen atom, an alkyl group having 1 to 5 carbon atoms, or a halogen atom. $R^{a27}$ represents an epoxy group-containing group or a hydrocarbon group which may have a substituent.]

In Formula (anv2), $R^{a24}$ represents a hydrocarbon group which may have a substituent. Examples of the hydrocarbon group which may have a substituent include a linear or branched alkyl group and a cyclic hydrocarbon group.

The linear alkyl group preferably has 1 to 5 carbon atoms, more preferably 1 to 4 carbon atoms, and still more preferably 1 or 2 carbon atoms. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

The branched alkyl group preferably has 3 to 10 carbon atoms and more preferably 3 to 5 carbon atoms. Specific examples thereof include an isopropyl group, an isobutyl group, a tert-butyl group, an isopentyl group, a neopentyl group, a 1,1-diethylpropyl group, and a 2,2-dimethylbutyl group. Among these, an isopropyl group is preferable.

In a case where $R^{a24}$ represents a cyclic hydrocarbon group, the cyclic hydrocarbon group may be an aliphatic hydrocarbon group or an aromatic hydrocarbon group, and may be a polycyclic group or a monocyclic group.

As the aliphatic hydrocarbon group which is a monocyclic group, a group formed by removing one hydrogen atom from a monocycloalkane is preferable. As the monocycloalkane, a group having 3 to 6 carbon atoms is preferable, and specific examples thereof include cyclopentane and cyclohexane.

As the aliphatic hydrocarbon group which is a polycyclic group, a group formed by removing one hydrogen atom from a polycycloalkane is preferable. As the polycycloalkane, a group having 7 to 12 carbon atoms is preferable, and specific examples of the polycycloalkane include adamantane, norbornane, isobornane, tricyclodecane, and tetracyclododecane.

In a case where the cyclic hydrocarbon group of $R^{24}$ is an aromatic hydrocarbon group, the aromatic hydrocarbon group is a hydrocarbon group having at least one aromatic ring.

The aromatic ring is not particularly limited as long as the aromatic ring has a cyclic conjugated system having $(4n+2)\pi$ electrons, and may be monocyclic or polycyclic.

The number of carbon atoms in the aromatic ring is preferably in a range of 5 to 30, more preferably in a range of 5 to 20, still more preferably in a range of 6 to 15, and particularly preferably in a range of 6 to 12. Examples of the aromatic ring include an aromatic hydrocarbon ring such as benzene, naphthalene, anthracene, or phenanthrene; and an aromatic hetero ring in which part of the carbon atoms constituting the aromatic hydrocarbon ring have been substituted with hetero atoms. Examples of the hetero atoms in the aromatic hetero ring include an oxygen atom, a sulfur atom, and a nitrogen atom. Specific examples of the aromatic hetero ring include a pyridine ring and a thiophene ring.

Specific examples of the aromatic hydrocarbon group of $R^{a24}$ include a group (an aryl group or a heteroaryl group) formed by removing one hydrogen atom from the aromatic hydrocarbon ring or aromatic hetero ring; a group formed by removing one hydrogen atom from an aromatic compound (biphenyl, fluorene or the like) having two or more aromatic rings; and a group (for example, an arylalkyl group such as a benzyl group, a phenethyl group, a 1-naphthylmethyl group, a 2-naphthylmethyl group, a 1-naphthylethyl group, or a 2-naphthylethyl group) in which one hydrogen atom in an aromatic hydrocarbon ring or aromatic hetero ring has been substituted with an alkylene group. The number of carbon atoms in the alkylene group which is bonded to the aromatic hydrocarbon ring or aromatic hetero ring is preferably in a range of 1 to 4, more preferably 1 or 2, and particularly preferably 1 carbon atom.

In Formulae (anv2) and (anv3), $R^{a25}$ and $R^{a26}$, and $R^{a28}$ to $R^{a30}$ each independently represent a hydrogen atom, an alkyl group having 1 to 5 carbon atoms, or a halogen atom, and the alkyl group having 1 to 5 carbon atoms and the halogen atom each have the same definition as that for $R^{a22}$ and $R^{a23}$.

In Formula (anv3), $R^{a27}$ represents an epoxy group-containing group or a hydrocarbon group which may have a substituent. The epoxy group-containing group as $R^{a27}$ has the same definition as that for $R^{EP}$ in Formula (A1), and the hydrocarbon group which may have a substituent as $R^{a27}$ has the same definition as that for $R^{a24}$.

Specific examples of the constitutional units represented by Formula (anv2) and (anv3) are shown below.

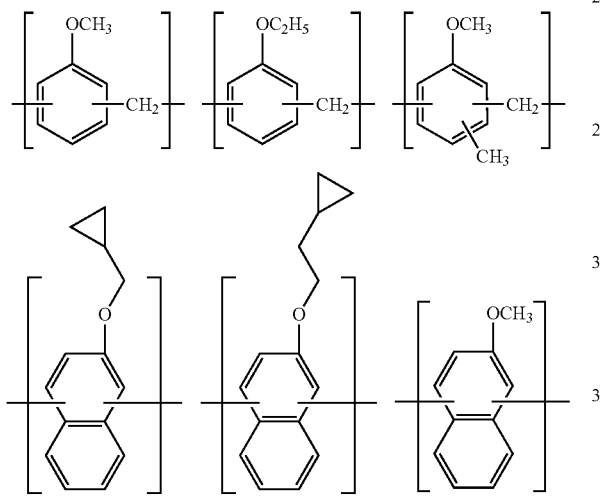

In a case where the novolak type epoxy resin (Anv) has other constitutional units in addition to the constitutional unit (anv1), the proportion of each constitutional unit in the resin (Anv) is not particularly limited, but the total amount of the constitutional units containing an epoxy group is preferably in a range of 10% to 90% by mole, more preferably in a range of 20% to 80% by mole, and still more preferably in a range of 30% to 70% by mole with respect to the total amount of all constitutional units constituting the resin (Anv).

<<Bisphenol A Type Epoxy Resin (Abp)>>

Examples of the bisphenol A type epoxy resin (Abp) include an epoxy resin having a structure represented by Formula (abp1).

In Formula (abp1), the alkyl group having 1 to 5 carbon atoms as $R^{a31}$ and $R^{a32}$ has the same definition as that for $R^{p1}$ and $R^{p2}$ in Formula (A1). Among the examples, it is preferable that $R^{a31}$ and $R^{a32}$ represent a hydrogen atom or a methyl group.

$R^{EP}$ has the same definition as that for $R^{EP}$ in Formula (A1), and it is preferable that $R^{EP}$ represent a glycidyl group.

<<Aliphatic Epoxy Resin and Acrylic Resin (Aac)>>

Examples of the aliphatic epoxy resin and the acrylic resin (Aac) include resins having epoxy group-containing units represented by Formulae (a1-1) and (a1-2).

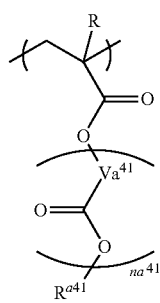

(a1-1)

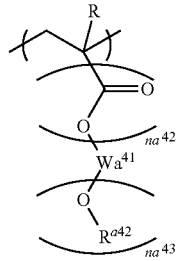

(a1-2)

[In the formulae, R represents a hydrogen atom, an alkyl group having 1 to 5 carbon atoms, or a halogenated alkyl group having 1 to 5 carbon atoms. $Va^{41}$ represents a divalent hydrocarbon group which may have a substituent. $na^{41}$ represents an integer of 0 to 2. $R^{a41}$ and $R^{a42}$ represent an epoxy group-containing group. $na^{42}$ represents 0 or 1. $Wa^{41}$ represents an $(na^{43}+1)$-valent aliphatic hydrocarbon group. $na^{43}$ represents an integer of 1 to 3.]

In Formula (a1-1), R represents a hydrogen atom, an alkyl group having 1 to 5 carbon atoms, or a halogenated alkyl group having 1 to 5 carbon atoms.

As the alkyl group having 1 to 5 carbon atoms represented by R, a linear or branched alkyl group is preferable, and specific examples thereof include a methyl group, an ethyl group, a propyl group, an isopropyl group, an n-butyl group, an isobutyl group, a tert-butyl group, a pentyl group, an isopentyl group, and a neopentyl group.

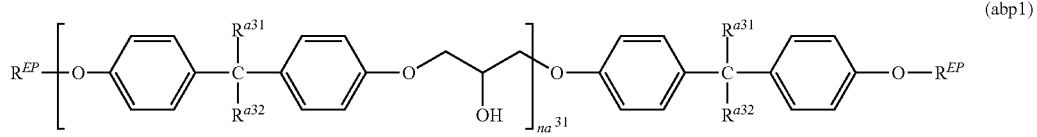

(abp1)

[In the formula, $R^{EP}$ represents an epoxy group-containing group, $R^{a31}$ and $R^{a32}$ each independently represent a hydrogen atom or an alkyl group having 1 to 5 carbon atoms, and $na^{31}$ represents an integer of 1 to 50.]

The halogenated alkyl group having 1 to 5 carbon atoms of R is a group in which part or all of the hydrogen atoms in the alkyl group having 1 to 5 carbon atoms have been substituted with halogen atoms. Examples of the halogen atom include a fluorine atom, a chlorine atom, a bromine atom, and an iodine atom. Among these, a fluorine atom is particularly preferable.

As R, a hydrogen atom, an alkyl group having 1 to 5 carbon atoms, or a fluorinated alkyl group having 1 to 5 carbon atoms is preferable, and a hydrogen atom or a methyl group is most preferable from the viewpoint of industrial availability.

In Formula (a1-1), $Va^{41}$ represents a divalent hydrocarbon group which may have a substituent, and examples thereof are the same as those for the divalent hydrocarbon group which may have a substituent, described in the section of $R^{EP}$ in Formula (A1).

Among these, as the hydrocarbon group represented by $Va^{41}$, an aliphatic hydrocarbon group is preferable, a linear or branched aliphatic hydrocarbon group is more preferable, a linear aliphatic hydrocarbon group is still more preferable, and a linear alkylene group is particularly preferable.

In Formula (a1-1), $na^{41}$ represents an integer of 0 to 2 and preferably 0 or 1.

In Formulae (a1-1) and (a1-2), $R^{a41}$ and $R^{a42}$ represent an epoxy group-containing group and have the same definition as that for $R^{EP}$ in Formula (A1).

In Formula (a1-2), the $(na^{43}+1)$-valent aliphatic hydrocarbon group of $Wa^{41}$ indicates a hydrocarbon group with no aromaticity and may be saturated or unsaturated. In general, it is preferable that the aliphatic hydrocarbon group be saturated. Examples of the aliphatic hydrocarbon group include a linear or branched aliphatic hydrocarbon group, an aliphatic hydrocarbon group having a ring in the structure thereof, and a group formed by combining a linear or branched aliphatic hydrocarbon group and an aliphatic hydrocarbon group having a ring in the structure thereof.

In Formula (a1-2), $na^{43}$ represents an integer of 1 to 3 and preferably 1 or 2.

Specific examples of the constitutional unit represented by Formula (a1-1) or (a1-2) are shown below.

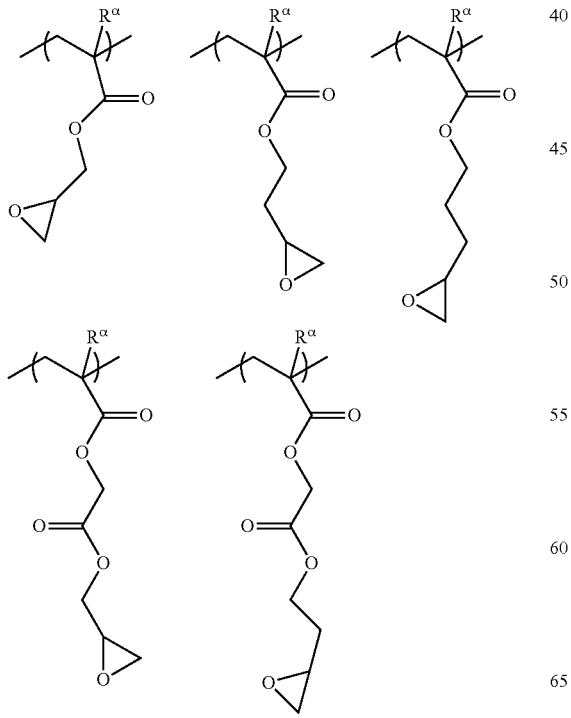

-continued

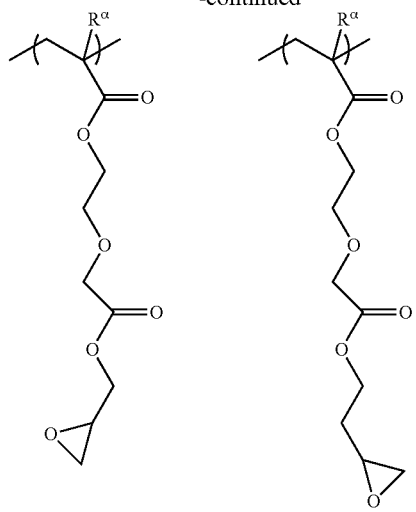

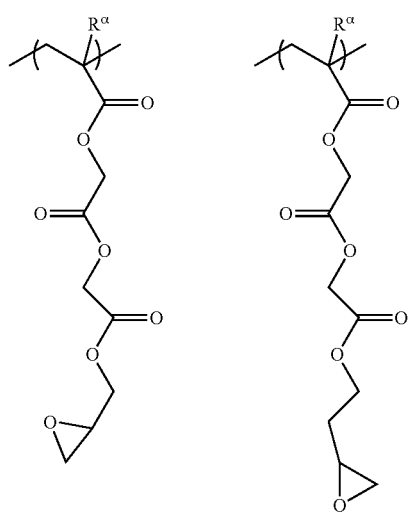

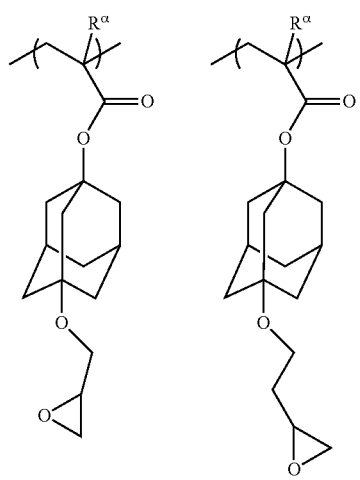

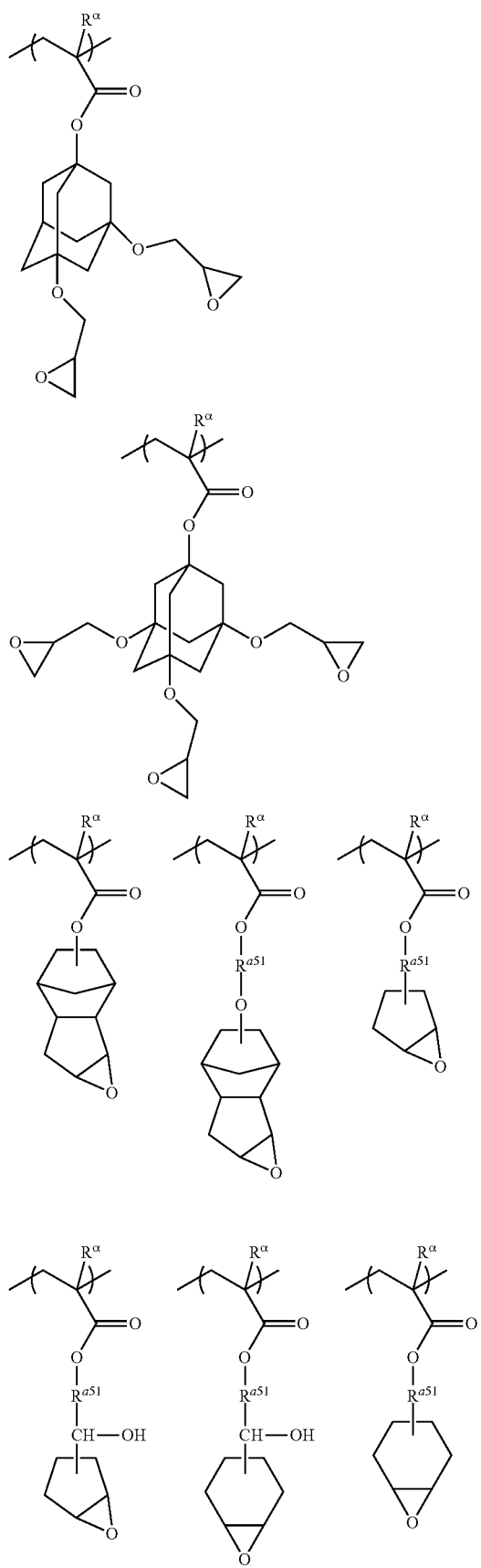
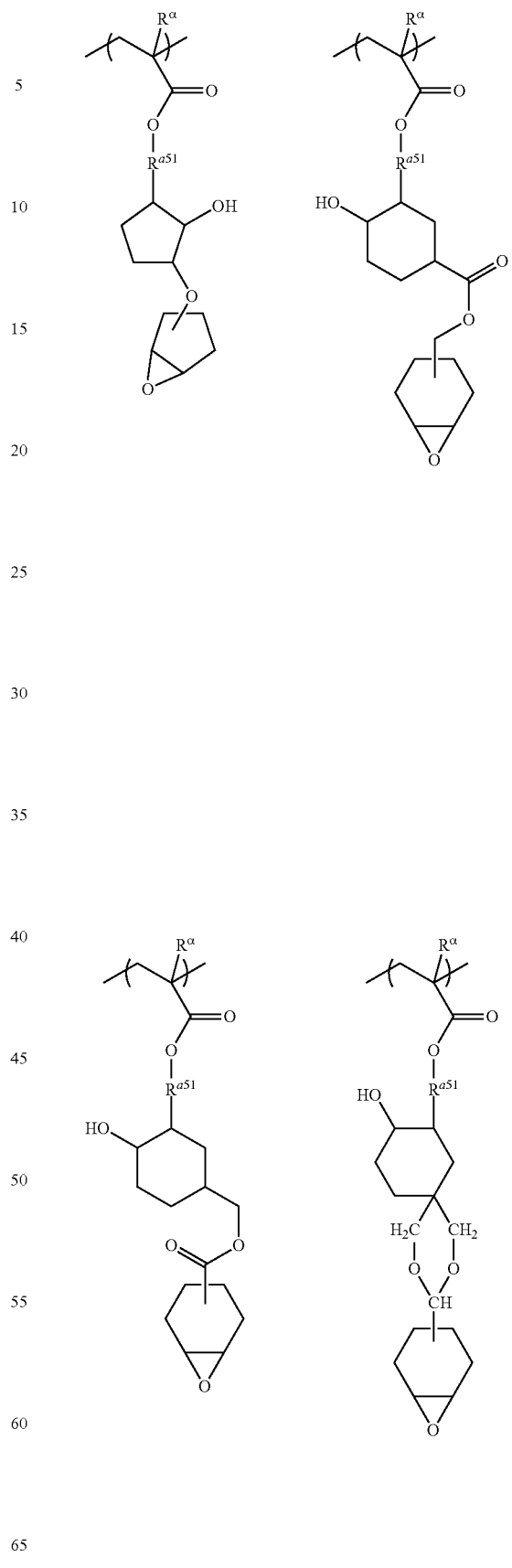

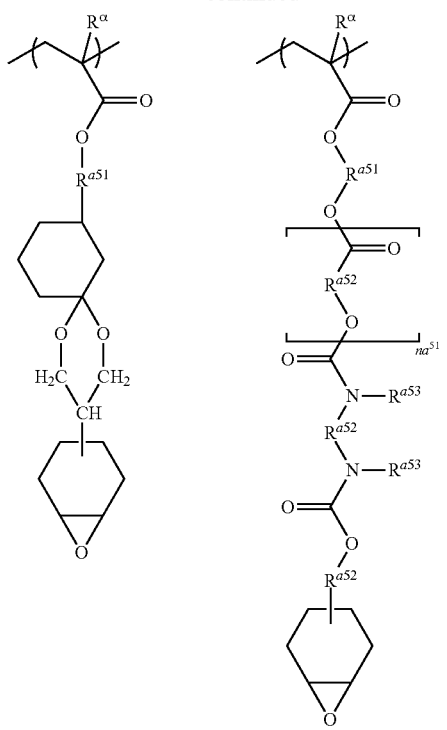

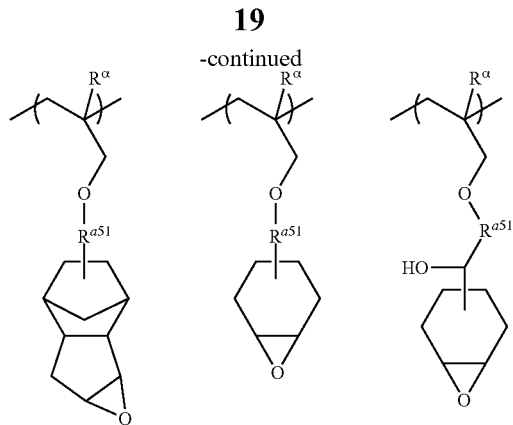

In the formulae, $R^\alpha$ represents a hydrogen atom, a methyl group, or a trifluoromethyl group.

$R^{a51}$ represents a divalent hydrocarbon group having 1 to 8 carbon atoms. $R^{a52}$ represents a divalent hydrocarbon group having 1 to 20 carbon atoms. $R^{a53}$ represents a hydrogen atom or a methyl group. $na^{51}$ represents an integer of 0 to 10.

$R^{a51}$, $R^{a52}$, and $R^{a53}$ may be the same as or different from one another.

Further, the acrylic resin (Aac) may have constitutional units derived from other polymerizable compounds for the purpose of appropriately controlling the physical and chemical characteristics. Examples of such polymerizable compounds include known radical polymerizable compounds and anionic polymerizable compounds. Examples of such polymerizable compounds include monocarboxylic acids such as acrylic acid, methacrylic acid, and crotonic acid; dicarboxylic acids such as maleic acid, fumaric acid, and itaconic acid; methacrylic acid derivatives containing a carboxyl group and an ester bond such as 2-methacryloyloxyethyl succinic acid, 2-methacryloyloxyethyl maleic acid, 2-methacryloyloxyethyl phthalic acid, and 2-methacryloyloxyethyl hexahydrophthalic acid; (meth)acrylic acid alkyl esters such as methyl (meth)acrylate, ethyl (meth)acrylate, and butyl (meth)acrylate; (meth)acrylic acid hydroxy alkyl esters such as 2-hydroxyethyl (meth)acrylate and 2-hydroxypropyl (meth)acrylate; (meth)acrylic acid aryl esters such as phenyl (meth)acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene, and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide.

In a case where the aliphatic epoxy resin and the acrylic resin (Aac) have other constitutional units, the content ratio of the epoxy group-containing unit in the resin is preferably in a range of 5% to 40% by mole, more preferably in a range of 10% to 30% by mole, and most preferably in a range of 15% to 25% by mole.

Further, suitable examples of the aliphatic epoxy resin also include a compound (hereinafter, also referred to as a "component (m1)") having a partial structure represented by formula (m1).

[In the formula, $n_2$ represents an integer of 1 to 4, and the symbol "*" represents a bonding site.]

In Formula (m1), $n_2$ represents an integer of 1 to 4, preferably an integer of 1 to 3, and more preferably 2.

Further, suitable examples of the aliphatic epoxy resin also include a compound (hereinafter, also referred to as a "component (m2)") represented by formula (m2).

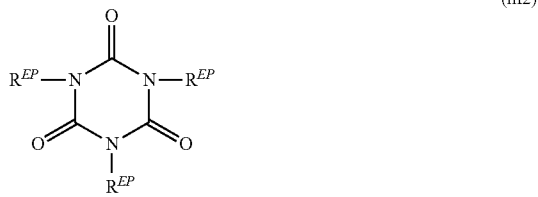

[In the formula, $R^{EP}$ represents an epoxy group-containing group. A plurality of $R^{EP}$'s may be the same as or different from each other.]

In Formula (m2), $R^{EP}$ represents an epoxy group-containing group and has the same definition as that for $R^{EP}$ in Formula (A1).

The component (A) may be used alone or in a combination of two or more kinds thereof.

It is preferable that the component (A) contain at least one resin selected from the group consisting of a novolak type epoxy resin (Anv), a bisphenol A type epoxy resin (Abp), a bisphenol F type epoxy resin, an aliphatic epoxy resin, and an acrylic resin (Aac).

Among these, it is more preferable that the component (A) contain at least one resin selected from the group consisting of a novolak type epoxy resin (Anv), a bisphenol A type resin (Abp), an aliphatic epoxy resin, and an acrylic resin (Aac).

Among these, it is still more preferable that the component (A) contain at least one resin selected from the group consisting of a novolak type epoxy resin (Anv), an aliphatic epoxy resin, and an acrylic resin (Aac).

In a case where the component (A) is used in a combination of two or more kinds thereof, it is particularly preferable that the component (A) contain a combination of a novolak type epoxy resin (Anv) and an aliphatic epoxy resin.

Specific examples of such a combination include a combination of a component (A1) and at least one (hereinafter, referred to as a "component (m)") selected from the group consisting of a component (m1) and a component (m2). Among these, a combination of a component (A1), a component (m1), and a component (m2) is most preferable.

From the viewpoint of the balance between the hardness and the flexibility of the cured film, the mass ratio between the component (A1) and the component (m) (component (A1)/component (m)) is preferably in a range of 75/25 to 95/5, more preferably in a range of 80/20 to 95/5, and still more preferably in a range of 85/15 to 95/5.

The mass average molecular weight of the component (A) in terms of polystyrene is preferably in a range of 100 to 300000, more preferably in a range of 200 to 200000, and still more preferably in a range of 300 to 200000. By setting the mass average molecular weight to be in the above-described range, the film is unlikely to be peeled off from the support and the hardness of the cured film to be formed is sufficiently increased.

Further, the dispersity of the component (A) is preferably 1.05 or greater. By setting the dispersity thereof to such a value, lithography characteristics in pattern formation are further improved.

The dispersity here indicates a value obtained by dividing the mass average molecular weight by the number average molecular weight.

Examples of commercially available products of the component (A) include, as novolak type epoxy resins (Anv), JER-152, JER-154, JER-157S70, and JER-157S65 (all manufactured by Mitsubishi Chemical Corporation), EPICLON N-740, EPICLON N-740, EPICLON N-770, EPICLON N-775, EPICLON N-660, EPICLON N-665, EPICLON N-670, EPICLON N-673, EPICLON N-680, EPICLON N-690, EPICLON N-695, and EPICLON HP-5000 (all manufactured by DIC Corporation), and EOCN-1020 (manufactured by Nippon Kayaku Co., Ltd.).

Examples of commercially available products of the component (A) include, as bisphenol A type epoxy resins (Abp), JER-827, JER-828, JER-834, JER-1001, JER-1002, JER-1003, JER-1055, JER-1007, JER-1009, and JER-1010 (all manufactured by Mitsubishi Chemical Corporation), and EPICLON 860, EPICLON 1050, EPICLON 1051, and EPICLON 1055 (all manufactured by DIC Corporation).

Examples of commercially available products of the component (A) include, as bisphenol F type epoxy resins, JER-806, JER-807, JER-4004, JER-4005, JER-4007, and JER-4010 (all manufactured by Mitsubishi Chemical Corporation), EPICLON830 and EPICLON835 (both manufactured by DIC Corporation), and LCE-21 and RE-602S (both manufactured by Nippon Kayaku Co., Ltd.).

Examples of commercially available products of the component (A) include, as aliphatic epoxy resins, ADEKA RESIN EP-40805, ADEKA RESIN EP-40855, and ADEKA RESIN EP-40885 (all manufactured by ADEKA CORPORATION), CELLOXIDE 2021P, CELLOXIDE 2081, CELLOXIDE 2083, CELLOXIDE 2085, CELLOXIDE 8000, EHPE-3150, EPOLEAD PB 3600, and EPOLEAD PB4700 (all manufactured by Daicel Corporation), DENACOL EX-211L, EX-212L, EX-214L, EX-216L, EX-321L, and EX-850L (all manufactured by Nagase ChemteX Corporation), and TEPIC-VL (manufactured by Nissan Chemical Industries, Ltd.).

The content of the component (A) in the photosensitive composition according to the present embodiment may be adjusted according to the film thickness and the like of the photosensitive resin film intended to be formed.

<Metal Oxide (M)>

A cured film with improved hardness can be obtained from the photosensitive composition according to the present embodiment by using a metal oxide (component (M)) together with the compound (A) and the component (I). Further, a pattern having an excellent shape and high resolution can be formed.

Examples of the component (M) include oxides of metals such as silicon (metallic silicon), zirconium, and hafnium. Among these, an oxide of silicon is preferable. In addition, it is particularly preferable to use silica.

Further, it is preferable that the component (M) be a particulate.

Such a particulate component (M) preferably consist of particles having a volume average particle diameter of 5 to 40 nm, more preferably particles having a volume average particle diameter of 5 to 30 nm, and still more preferably particles having a volume average particle diameter of 10 to 20 nm.

In a case where the volume average particle diameter of the component (M) is greater than or equal to the lower limit of the above-described preferable range, the hardness of the cured film is likely to be increased. Further, in a case where the volume average particle diameter thereof is lower than or equal to the upper limit of the above-described preferable range, residues are unlikely to be generated during pattern formation, and a pattern with higher resolution is easily formed. In addition, the transparency of the resin film can be improved.

The particle diameter of the component (M) may be appropriately selected according to the exposure light source. Generally, a particle having a particle diameter of 1/10 or less of the wavelength of light is considered to be hardly affected by light scattering. Therefore, for example, in a case where a fine structure is formed using photolithography with an i-line (365 nm), it is preferable that particles having a primary particle diameter (volume average value) of 10 to 20 nm (particularly preferably the group of silica particles) be used as the component (M).

The component (M) may be used alone or in a combination of two or more kinds thereof.

The content of the component (M) is preferably in a range of 10 to 30 parts by mass and more preferably in a range of 15 to 25 parts by mass with respect to 100 parts by mass of the component (A).

In a case where the content of the component (M) is greater than or equal to the lower limit of the above-described preferable range, the hardness of the cured film is likely to be increased. Further, in a case where the content thereof is lower than or equal to the upper limit of the above-described preferable range, the transparency of the resin film can be further improved. In addition, the fluidity of the photosensitive composition is likely to be maintained.

<Cationic Polymerization Initiator (I)>

As a cationic polymerization initiator (component (I)), a component containing one or more selected from the group consisting of a compound represented by Formula (I1) (hereinafter, referred to as a "component (I1)") and a compound represented by Formula (I2) (hereinafter, referred to as a "component (I2)") is used.

Since relatively strong acids are generated upon exposure from both of the component (I1) and the component (I2), in a case where a pattern is formed using a photosensitive composition that contains the component (I), sufficient sensitivity is obtained so that an excellent pattern is formed.

(I1)

(I2)

[In the formulae, $R^{b01}$ to $R^{b04}$ each independently represent an aryl group which may have a substituent or a fluorine atom. $R^{b05}$ represents a fluorinated alkyl group which may have a substituent or a fluorine atom. A plurality of $R^{b05}$'s may be the same as or different from one another. q represents an integer of 1 or greater. $Q^{q+}$'s each independently represent a q-valent organic cation.]

In Formula (I1), $R^{b01}$ to $R^{b04}$ each independently represent an aryl group which may have a substituent or a fluorine atom.

The aryl group as $R^{b01}$ to $R^{b04}$ preferably has 5 to 30 carbon atoms, more preferably 5 to 20 carbon atoms, still more preferably 6 to 15 carbon atoms, and particularly preferably 6 to 12 carbon atoms. Specific examples thereof include a naphthyl group, a phenyl group, and an anthracenyl group. Among these, a phenyl group is preferable from the viewpoint of availability.

The aryl group of $R^{b01}$ to $R^{b04}$ may have a substituent. The substituent is not particularly limited. As the substituent, a halogen atom, a hydroxyl group, an alkyl group (preferably a linear or branched alkyl group having 1 to 5 carbon atoms), or a halogenated alkyl group is preferable, a halogen atom or a halogenated alkyl group having 1 to 5 carbon atoms is more preferable, and a fluorine atom or a fluorinated alkyl group having 1 to 5 carbon atoms is particularly preferable. It is preferable that an aryl group have a fluorine atom because the polarity of the anion moiety is increased.

Among these, $R^{b01}$ to $R^{b04}$ in Formula (I1) each preferably represent a fluorinated phenyl group and particularly preferably a perfluorophenyl group.

Specific preferred examples of the anion moiety of the compound represented by Formula (I1) include tetrakis(pentafluorophenyl)borate ($[B(C_6F_5)_4]^-$); tetrakis[(trifluoromethyl)phenyl]borate ($[B(C_6H_4CF_3)_4]^-$); difluorobis(pentafluorophenyl)borate ($[(C_6F_5)_2BF_2]^-$); trifluoro(pentafluorophenyl)borate ($[(C_6F_5)BF_3]^-$); and tetrakis(difluorophenyl)borate ($[B(C_6H_3F_2)_4]^-$).

Among these, tetrakis(pentafluorophenyl)borate ($[B(C_6F_5)_4]^-$) is particularly preferable.

In Formula (I2), $R^{b05}$ represents a fluorinated alkyl group which may have a substituent or a fluorine atom. A plurality of $R^{b05}$'s may be the same as or different from one another.

The fluorinated alkyl group of $R^{b05}$ preferably has 1 to 10 carbon atoms, more preferably 1 to 8 carbon atoms, and still more preferably 1 to 5 carbon atoms. Specific examples thereof include a group in which part or all of the hydrogen atoms in an alkyl group having 1 to 5 carbon atoms have been substituted with fluorine atoms.

Among the examples, $R^{b05}$ preferably represents a fluorine atom or a fluorinated alkyl group having 1 to 5 carbon atoms, more preferably a fluorine atom or a perfluoroalkyl group having 1 to 5 carbon atoms, and still more preferably a fluorine atom, a trifluoromethyl group, or a pentafluoroethyl group.

It is preferable that the anion moiety of the compound represented by Formula (I2) be represented by Formula (b0-2a).

(b0-2a)

[In the formula, $R^{b05}$ represents a fluorinated alkyl group which may have a substituent. $nb^1$ represents an integer of 1 to 5.]

In Formula (b0-2a), the fluorinated alkyl group which may have a substituent as $R^{bf05}$ has the same definition as the fluorinated alkyl group which may have a substituent as $R^{b05}$.

In Formula (b0-2a), nb1 preferably represents an integer of 1 to 4, more preferably an integer of 2 to 4, and most preferably 3.

In Formulae (I1) and (I2), q represents an integer of 1 or greater. $Q^{q+}$'s each independently represent a q-valent organic cation.

Suitable examples of $Q^{q+}$ include a sulfonium cation and an iodonium cation. Further, organic cations represented by Formulae (ca-1) to (ca-5) are particularly preferable.

(ca-1)

(ca-2)

(ca-3)

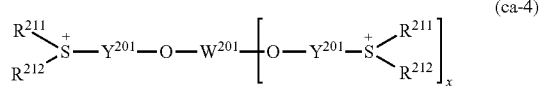
(ca-4)

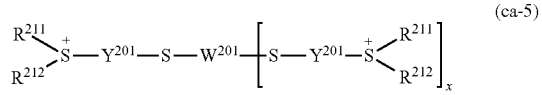
(ca-5)

[In the formulae, $R^{201}$ to $R^{207}$, and $R^{211}$ and $R^{212}$ each independently represent an aryl group which may have a substituent, a heteroaryl group which may have a substituent, an alkyl group which may have a substituent, or an alkenyl group which may have a substituent. $R^{201}$ to $R^{203}$, $R^{206}$ and $R^{207}$, and $R^{211}$ and $R^{212}$ may be bonded to one another to form a ring together with a sulfur atom in the formulae. $R^{208}$ and $R^{209}$ each independently represent a hydrogen atom or an alkyl group having 1 to 5 carbon atoms. $R^{210}$ represents an aryl group which may have a substituent, an alkyl group which may have a substituent, an alkenyl group which may have a substituent, or a —$SO_2$-containing cyclic group which may have a substituent. $L^{201}$ represents —C(=O)— or —C(=O)—O—. $Y^{201}$'s each independently represent an arylene group, an alkylene group, or an alkenylene group. x represents 1 or 2. $W^{201}$ represents an (x+1)-valent linking group.]

Examples of the aryl group of $R^{201}$ to $R^{207}$ and $R^{211}$ and $R^{212}$ include a substituted or unsubstituted aryl group having 6 to 20 carbon atoms. Among these, a phenyl group or a naphthyl group is preferable.

Examples of the heteroaryl group of $R^{201}$ to $R^{207}$, and $R^{211}$ and $R^{212}$ include those in which part of the carbon atoms constituting the aryl group have been substituted with hetero atoms.

Examples of the hetero atom include an oxygen atom, a sulfur atom, and a nitrogen atom. Examples of this heteroaryl group include a group formed by removing one hydrogen atom from 9H-thioxanthene; and a group formed by removing one hydrogen atom from 9H-thioxanthene-9-one.

As the alkyl group represented by $R^{201}$ to $R^{207}$ and $R^{211}$ and $R^{212}$, a chain or cyclic alkyl group having 1 to 30 carbon atoms is preferable.

As the alkenyl group represented by $R^{201}$ to $R^{207}$ and $R^{211}$ and $R^{212}$, an alkenyl group having 2 to 10 carbon atoms is preferable.

Examples of the substituent which may be included in $R^{201}$ to $R^{207}$ and $R^{210}$ to $R^{212}$ include an alkyl group, a halogen atom, a halogenated alkyl group, a carbonyl group, a cyano group, an amino group, an oxo group (=O), an aryl group, and groups represented by Formulae (ca-r-1) to (ca-r-10).

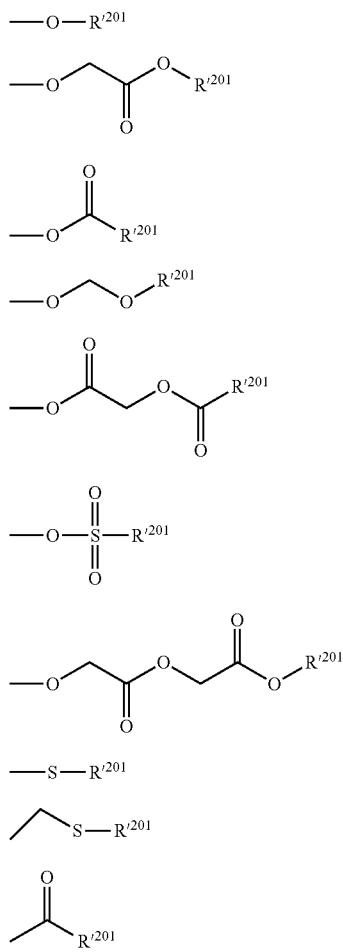

[ca-r-1]
[ca-r-2]
[ca-r-3]
[ca-r-4]
[ca-r-5]
[ca-r-6]
[ca-r-7]
[ca-r-8]
[ca-r-9]
[ca-r-10]

[In the formulae, $R'^{201}$'s each independently represent a hydrogen atom, a cyclic group which may have a substituent, a chain alkyl group which may have a substituent, or a chain alkenyl group which may have a substituent.]

In Formulae (ca-r-1) to (ca-r-10), $R'^{201}$'s each independently represent a hydrogen atom, a cyclic group which may have a substituent, a chain alkyl group which may have a substituent, or a chain alkenyl group which may have a substituent.

Cyclic group which may have substituent:

It is preferable that the cyclic group be a cyclic hydrocarbon group, and the cyclic hydrocarbon group may be an aromatic hydrocarbon group or an aliphatic hydrocarbon group. The aliphatic hydrocarbon group indicates a hydrocarbon group that has no aromaticity. Further, the aliphatic hydrocarbon group may be saturated or unsaturated. In general, it is preferable that the aliphatic hydrocarbon group be saturated.

The aromatic hydrocarbon group of $R'^{201}$ is a hydrocarbon group having an aromatic ring. The number of carbon atoms in the aromatic hydrocarbon group is preferably in a range of 3 to 30, more preferably in a range of 5 to 30, still more preferably in a range of 5 to 20, particularly preferably in a range of 6 to 15, and most preferably in a range of 6 to 10. Here, the number of carbon atoms thereof does not include the number of carbon atoms in the substituent.

Specific examples of the aromatic ring contained in the aromatic hydrocarbon group of $R'^{201}$ include benzene, fluorene, naphthalene, anthracene, phenanthrene, biphenyl, an aromatic hetero ring in which part of the carbon atoms constituting any of these aromatic rings have been substituted with hetero atoms, and a ring in which some hydrogen atoms constituting any of these aromatic rings or aromatic hetero rings have been substituted with an oxo group. Examples of the hetero atom in the aromatic hetero rings include an oxygen atom, a sulfur atom, and a nitrogen atom.

Specific examples of the aromatic hydrocarbon group of $R'^{201}$ include a group (an aryl group such as a phenyl group, a naphthyl group, or an anthracenyl group) formed by removing one hydrogen atom from the aromatic ring; a group (an arylalkyl group such as a benzyl group, a phenethyl group, a 1-naphthylmethyl group, a 2-naphthylmethyl group, a 1-naphthylethyl group, or a 2-naphthylethyl group) in which one hydrogen atom in the aromatic ring has been substituted with an alkylene group; a group formed by removing one hydrogen atom from a ring (such as anthraquinone) in which some hydrogen atoms constituting the aromatic ring have been substituted with an oxo group and the like; and a group formed by removing one hydrogen atom from an aromatic hetero ring (such as 9H-thioxanthene or 9H-thioxanthen-9-one). The alkylene group (an alkyl chain in the arylalkyl group) preferably has 1 to 4 carbon atom, more preferably 1 or 2 carbon atoms, and particularly preferably 1 carbon atom.

Examples of the cyclic aliphatic hydrocarbon group of $R'^{201}$ include an aliphatic hydrocarbon group containing a ring in the structure thereof.

Examples of the aliphatic hydrocarbon group containing a ring in the structure thereof include an alicyclic hydrocarbon group (a group formed by removing one hydrogen atom from an aliphatic hydrocarbon ring), a group in which an alicyclic hydrocarbon group is bonded to the terminal of a linear or branched aliphatic hydrocarbon group, and a group in which an alicyclic hydrocarbon group is interposed in a linear or branched aliphatic hydrocarbon group.

The alicyclic hydrocarbon group preferably has 3 to 20 carbon atoms and more preferably 3 to 12 carbon atoms.

The alicyclic hydrocarbon group may be a polycyclic group or a monocyclic group. As the monocyclic alicyclic hydrocarbon group, a group formed by removing one or more hydrogen atoms from a monocycloalkane is preferable. The number of carbon atoms of the monocycloalkane is preferably in a range of 3 to 6, and specific examples of such a monocycloalkane include cyclopentane and cyclohexane. As the polycyclic alicyclic hydrocarbon group, a group formed by removing one or more hydrogen atoms from a polycycloalkane is preferable, and the number of carbon atoms of the polycycloalkane is preferably in a range of 7 to 30. Among polycycloalkanes, a polycycloalkane having a bridged ring polycyclic skeleton, such as adamantane, norbornane, isobornane, tricyclodecane, or tetracyclododecane, and a polycycloalkane having a fused ring polycyclic skeleton, such as a cyclic group having a steroid skeleton are more preferable.

Among these examples, as the cyclic aliphatic hydrocarbon group of $R'^{201}$, a group formed by removing one or more hydrogen atoms from a monocycloalkane or a polycycloalkane is preferable, a group formed by removing one hydrogen atom from a polycycloalkane is more preferable, an adamantyl group or a norbornyl group is particularly preferable, and an adamantyl group is most preferable.

The number of carbon atoms in the linear or branched aliphatic hydrocarbon group which may be bonded to an alicyclic hydrocarbon group is preferably in a range of 1 to 10, more preferably in a range of 1 to 6, still more preferably in a range of 1 to 4, and most preferably in a range of 1 to 3.

As the linear aliphatic hydrocarbon group, a linear alkylene group is preferable, and specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferable, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$— and —$CH_2CH(CH_3)CH_2$—; and alkyltetramethylene groups such as —$CH(CH_3)CH_2CH_2CH_2$— and —$CH_2CH(CH_3)CH_2CH_2$—. As the alkyl group in the alkylalkylene group, a linear alkyl group having 1 to 5 carbon atoms is preferable.

Chain alkyl group which may have substituent:

The chain alkyl group of $R^{'201}$ may be linear or branched.

The linear alkyl group preferably has 1 to 20 carbon atoms, more preferably 1 to 15 carbon atoms, and most preferably 1 to 10 carbon atoms. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group, and a docosyl group.

The branched alkyl group preferably has 3 to 20 carbon atoms, more preferably 3 to 15 carbon atoms, and most preferably 3 to 10 carbon atoms. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain alkenyl group which may have substituent:

The chain alkenyl group of $R^{'201}$ may be linear or branched, and the number of carbon atoms thereof is preferably in a range of 2 to 10, more preferably in a range of 2 to 5, still more preferably in a range of 2 to 4, and particularly preferably 3. Examples of the linear alkenyl group include a vinyl group, a propenyl group (an allyl group), and a butynyl group. Examples of the branched alkenyl group include a 1-methylvinyl group, a 2-methylvinyl group, a 1-methylpropenyl group, and a 2-methylpropenyl group. Among the examples, as the chain alkenyl group, a linear alkenyl group is preferable, a vinyl group or a propenyl group is more preferable, and a vinyl group is particularly preferable.

Examples of the substituent in the cyclic group, the chain alkyl group, or the alkenyl group of $R^{'201}$ include an alkoxy group, a halogen atom, a halogenated alkyl group, a hydroxyl group, a carbonyl group, a nitro group, an amino group, an oxo group, the cyclic group of $R^{'201}$, an alkylcarbonyl group, and a thienylcarbonyl group.

Among these, it is preferable that $R^{'201}$ represent a cyclic group which may have a substituent or a chain alkyl group which may have a substituent.

In a case where $R^{201}$ to $R^{203}$, $R^{206}$ and $R^{207}$, and $R^{211}$ and $R^{212}$ are bonded to one another to form a ring together with a sulfur atom in the formula, these groups may be bonded to one another through a hetero atom such as a sulfur atom, an oxygen atom, or a nitrogen atom, or a functional group such as a carbonyl group, —SO—, —$SO_2$—, —$SO_3$—, —COO—, —CONH—, or —$N(R_N)$— (here, $R_N$ represents an alkyl group having 1 to 5 carbon atoms). As a ring to be formed, one ring containing the sulfur atom in the formula in the ring skeleton thereof is preferably a 3- to 10-membered ring and particularly preferably a 5- to 7-membered ring, including the sulfur atom. Specific examples of the ring to be formed include a thiophene ring, a thiazole ring, a benzothiophene ring, a thianthrene ring, a benzothiophene ring, a dibenzothiophene ring, a 9H-thioxanthene ring, a thioxanthone ring, a thianthrene ring, a phenoxathiin ring, a tetrahydrothiophenium ring, and a tetrahydrothiopyranium ring.

In Formula (ca-3), $R^{208}$ and $R^{209}$ each independently represent a hydrogen atom or an alkyl group having 1 to 5 carbon atoms and preferably a hydrogen atom or an alkyl group having 1 to 3 carbon atoms. In a case where $R^{208}$ and $R^{209}$ each represent an alkyl group, $R^{208}$ and $R^{209}$ may be bonded to each other to form a ring.

In Formula (ca-3), $R^{210}$ represents an aryl group which may have a substituent, an alkyl group which may have a substituent, an alkenyl group which may have a substituent, or a —$SO_2$-containing cyclic group which may have a substituent.

Examples of the aryl group of $R^{210}$ include an unsubstituted aryl group having 6 to 20 carbon atoms, and a phenyl group or a naphthyl group is preferable.

As the alkyl group of $R^{210}$, a chain or cyclic alkyl group having 1 to 30 carbon atoms is preferable.

The number of carbon atoms of the alkenyl group of $R^{210}$ is preferably in a range of 2 to 10.

In Formulae (ca-4) and (ca-5), $Y^{201}$'s each independently represent an arylene group, an alkylene group, or an alkenylene group.

Examples of the arylene group of $Y^{201}$ include a group formed by removing one hydrogen atom from an aryl group exemplified as the aromatic hydrocarbon group represented by $R^{'201}$.

Examples of the alkylene group and alkenylene group of $Y^{201}$ include a group formed by removing one hydrogen atom from a group exemplified as the chain alkyl group or the chain alkenyl group of $R^{'201}$.

In Formulae (ca-4) and (ca-5), x represents 1 or 2.

$W^{201}$ represents an (x+1)-valent linking group, that is, a divalent or trivalent linking group.

As a divalent linking group represented by $W^{201}$, a divalent hydrocarbon group which may have a substituent is preferable. Further, the same divalent hydrocarbon groups which may have a substituent exemplified in the section of $R^{EP}$ in Formula (A1) are preferable. The divalent linking group of $W^{201}$ may be linear, branched, or cyclic, and a cyclic divalent linking group is preferable. Among these, a group formed by combining two carbonyl groups at both ends of an arylene group or a group formed of only an arylene group is preferable. Examples of the arylene group include a phenylene group and a naphthylene group. Among these, a phenylene group is particularly preferable.

Examples of a trivalent linking group of $W^{201}$ include a group formed by removing one hydrogen atom from a divalent linking group of $W^{201}$ and a group in which the divalent linking group has been bonded to the divalent linking group. As the trivalent linking group of $W^{201}$, a group in which two carbonyl groups are bonded to an arylene group is preferable.

Specific suitable examples of the cation represented by Formula (ca-1) include cations represented by Formulae (ca-1-1) to (ca-1-24).

(ca-1-1)
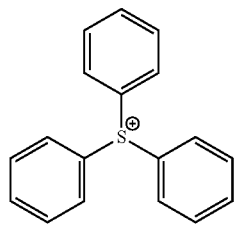

(ca-1-2)
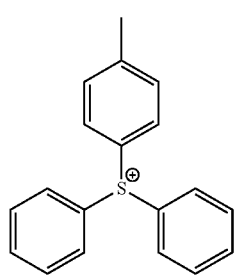

(ca-1-3)
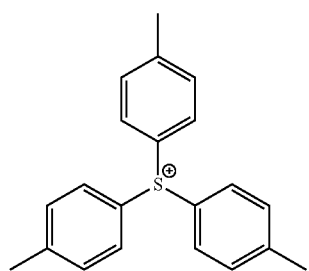

(ca-1-4)
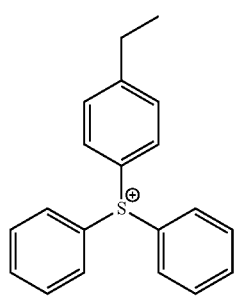

(ca-1-5)
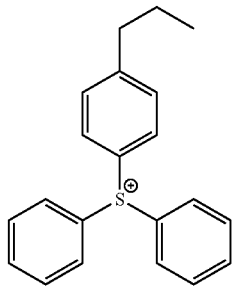

(ca-1-6)
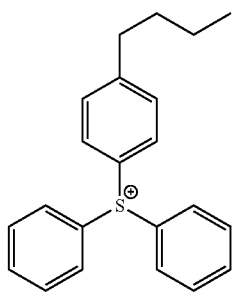

(ca-1-7)
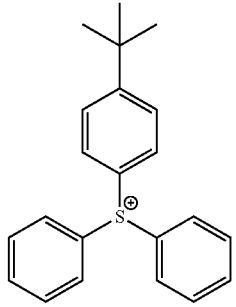

(ca-1-8)
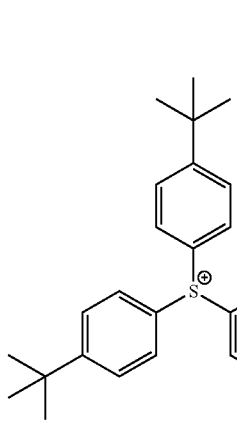

(ca-1-9)
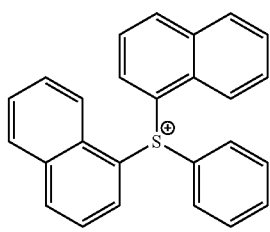

-continued
(ca-1-10)
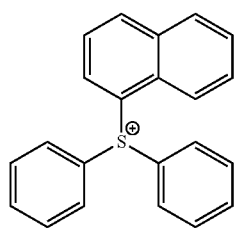
(ca-1-11)
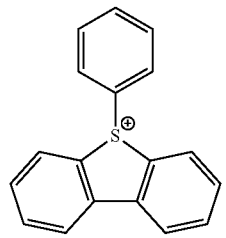
(ca-1-12)
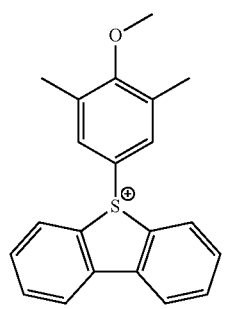
(ca-1-13)
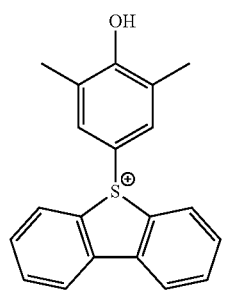
(ca-1-14)
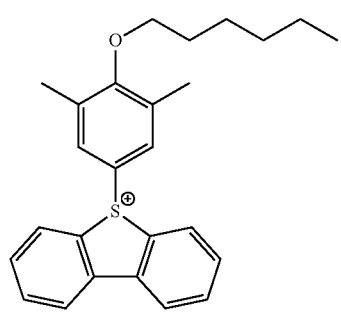
-continued
(ca-1-15)
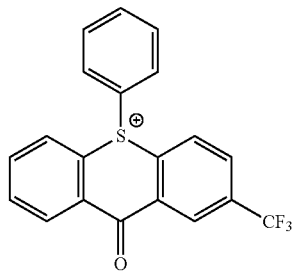
(ca-1-16)
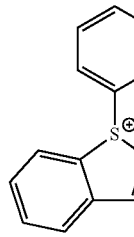
(ca-1-17)
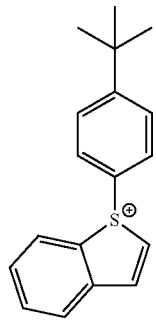
(ca-1-18)
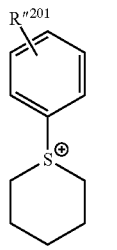
(ca-1-19)

(ca-1-20)
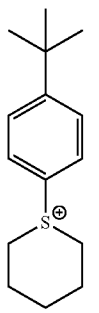
(ca-1-21)
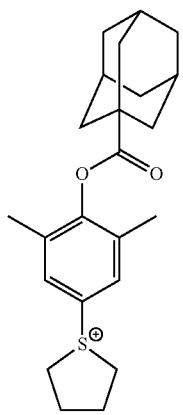
(ca-1-22)
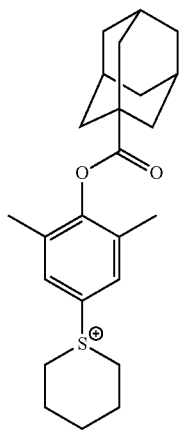
(ca-1-23)
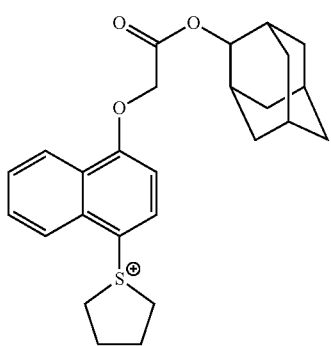
(ca-1-24)
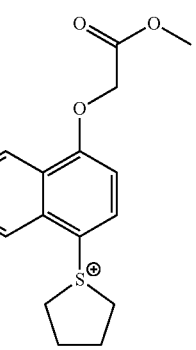
[In the formulae, $R''^{201}$ represents a hydrogen atom or a substituent. Examples of the substituent include those exemplified as the substituents which may be included in $R^{201}$ to $R^{207}$ and $R^{210}$ to $R^{212}$.]
Further, as the cation represented by Formula (ca-1), cations represented by Formulae (ca-1-25) to (ca-1-35) are also preferable.
(ca-1-25)
(ca-1-26)
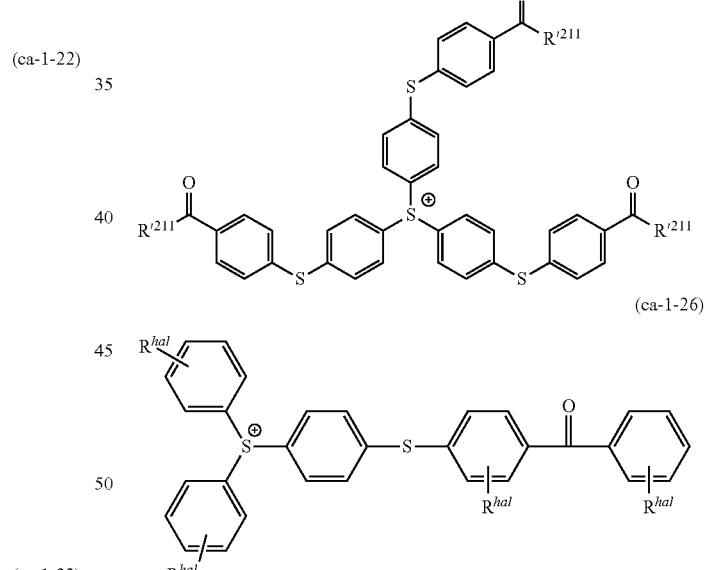
(ca-1-27)
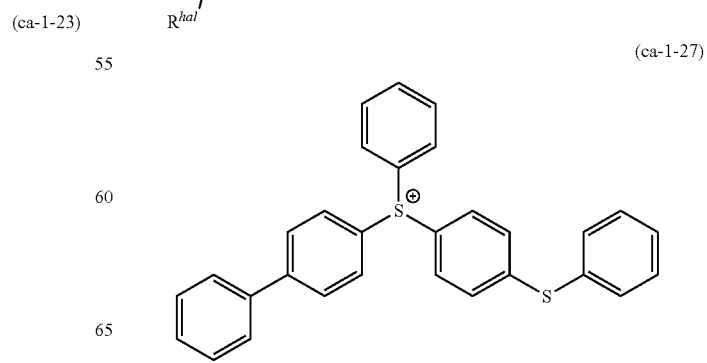

(ca-1-28)
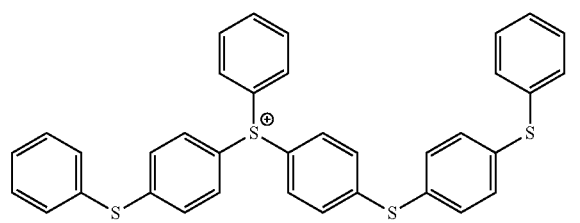
(ca-1-29)
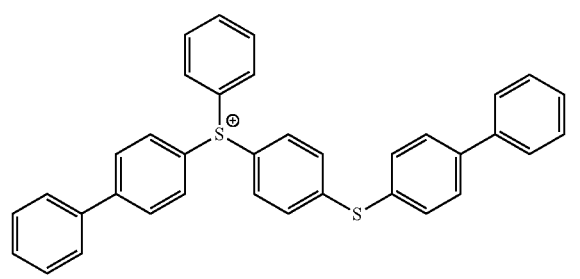
(ca-1-30)
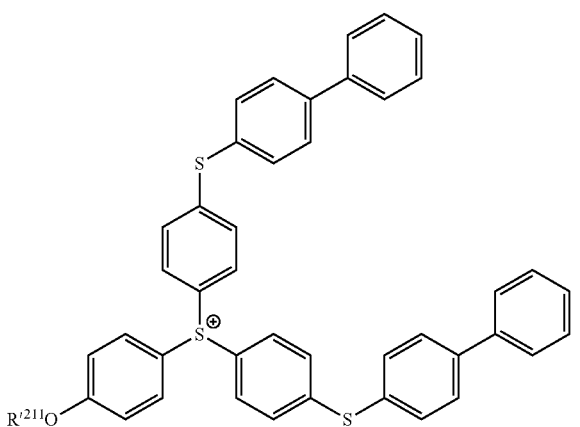
(ca-1-31)
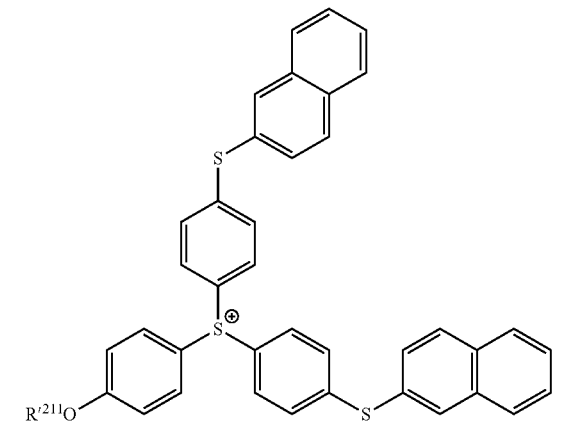
(ca-1-32)
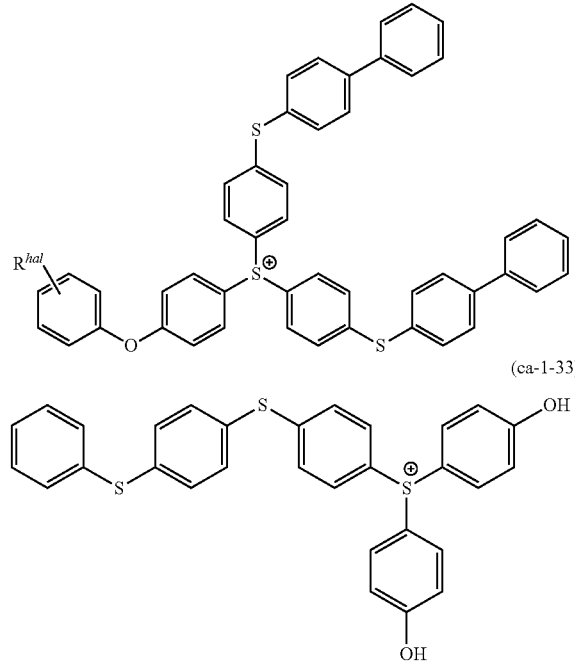
(ca-1-33)
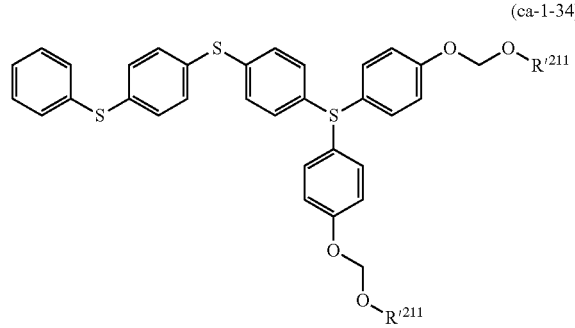
(ca-1-34)
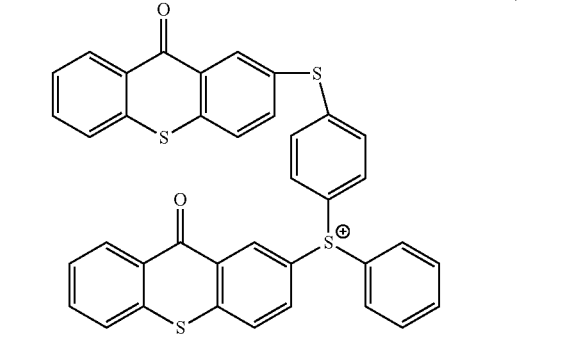
(ca-1-35)
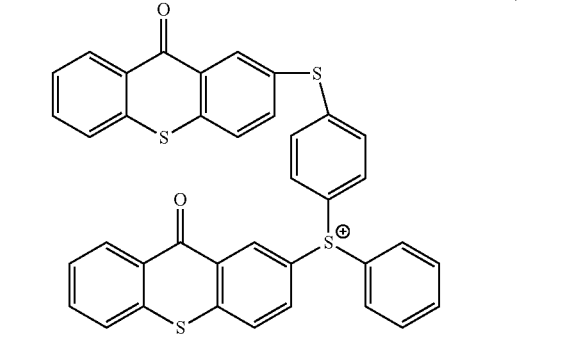
[In the formulae, $R'^{211}$ represents an alkyl group. $R^{hal}$ represents a hydrogen atom or a halogen atom.]
Further, as the cation represented by Formula (ca-1), cations represented by Formulae (ca-1-36) to (ca-1-46) are also preferable.

(ca-1-36)
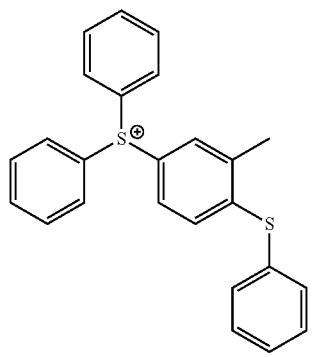
(ca-1-37)
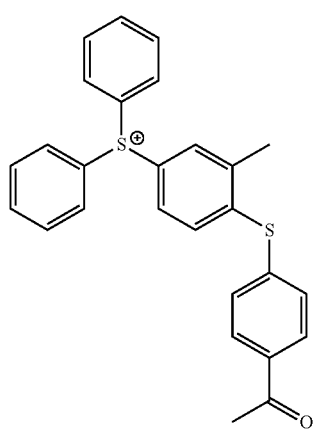
(ca-1-38)
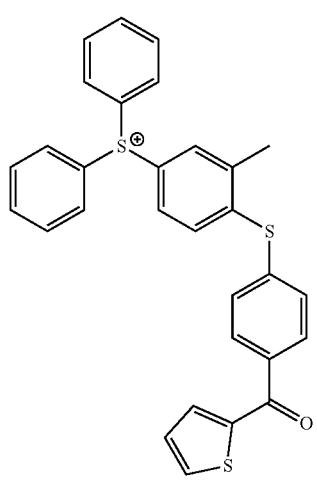
(ca-1-39)
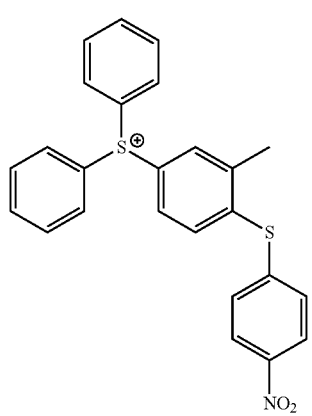
-continued
(ca-1-40)
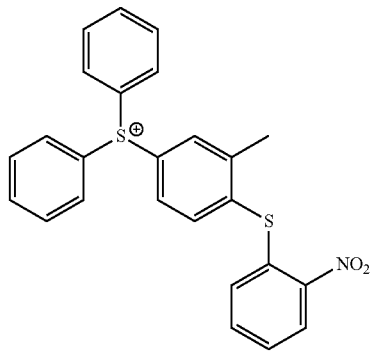
(ca-1-41)
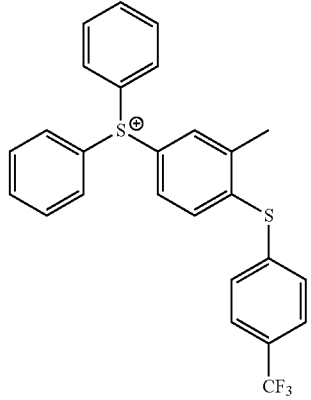
(ca-1-42)
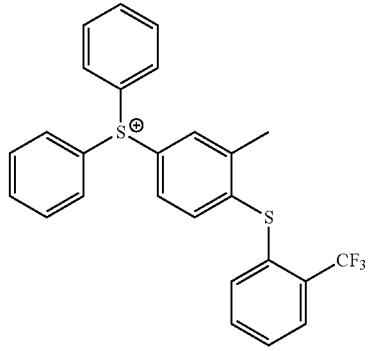

(ca-1-43)

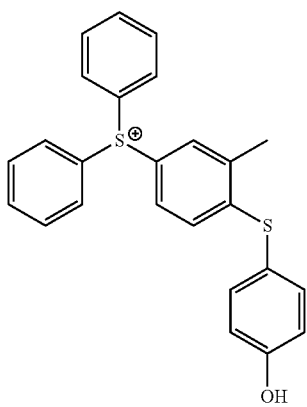

(ca-1-46)

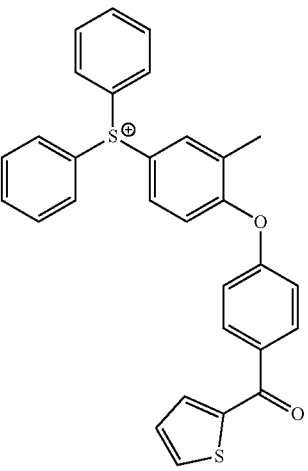

Specific suitable examples of the cation represented by Formula (ca-2) include a diphenyliodonium cation and a bis(4-tert-butylphenyl)iodonium cation.

Specific suitable examples of the cation represented by Formula (ca-4) include cations represented by Formulae (ca-4-1) and (ca-4-2) shown below.

(ca-1-44)

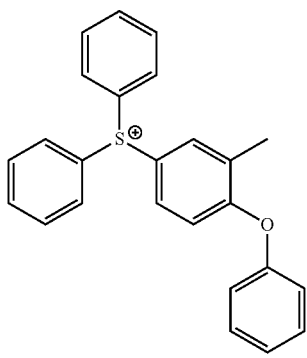

(ca-4-1)

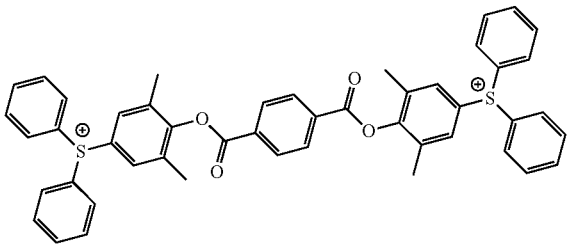

(ca-1-45)

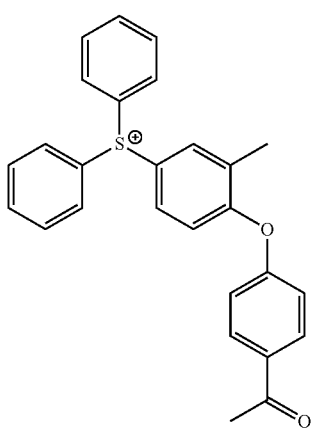

(ca-4-2)

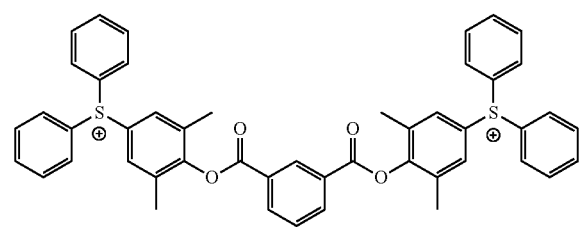

As the cation represented by Formula (ca-5), cations represented by Formulae (ca-5-1) to (ca-5-3) are preferable.

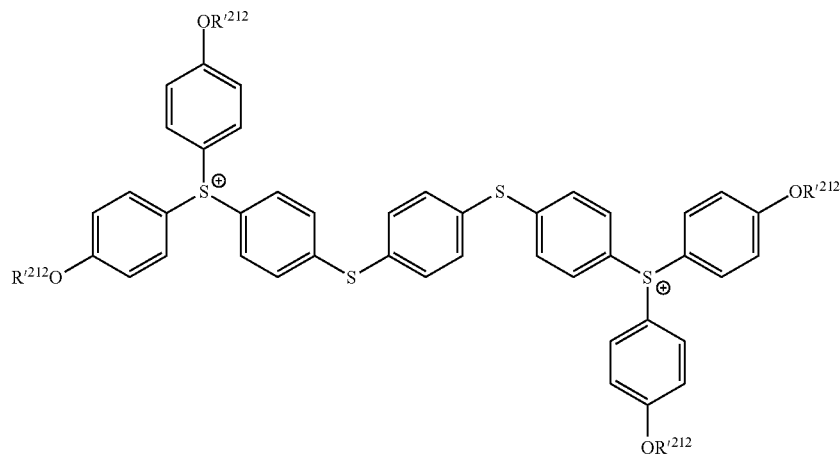
(ca-5-1)
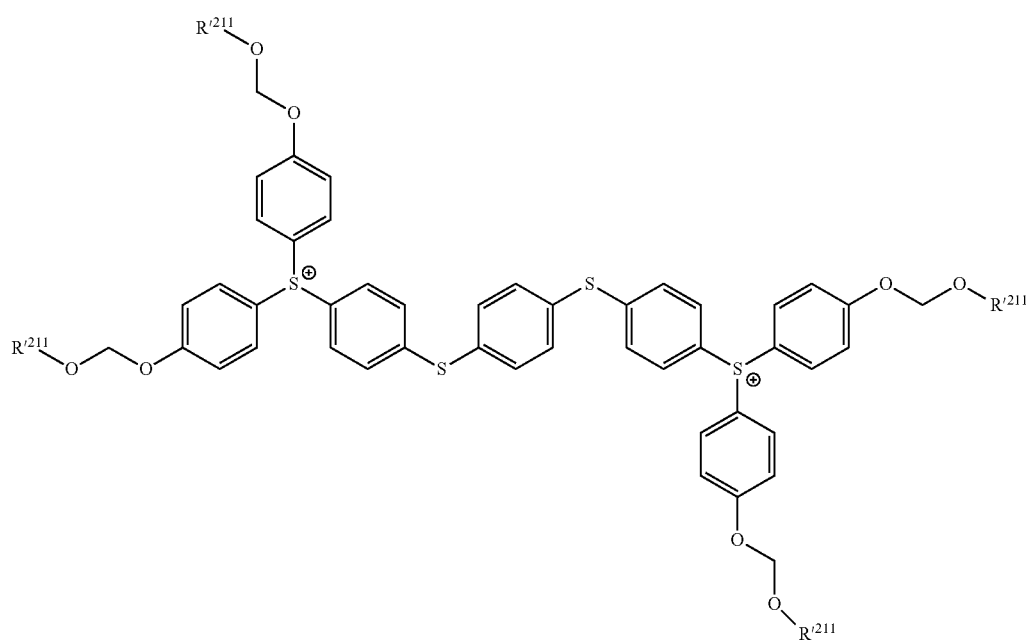
(ca-5-2)
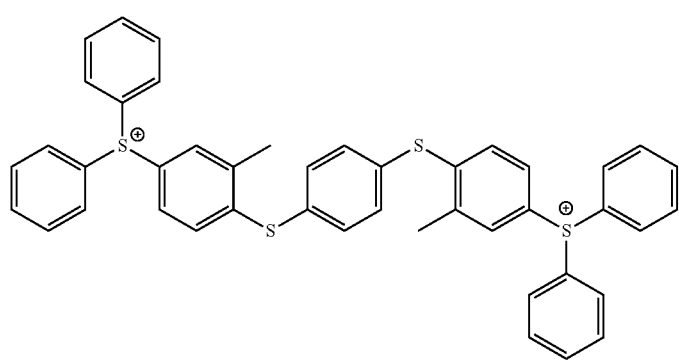
(ca-5-3)

[In the formula, $R'^{212}$ represents an alkyl group or a hydrogen atom. $R'^{211}$ represents an alkyl group.]

Among these, as the cation unit $[(Q^{q+})_{1/q}]$, a cation represented by Formula (ca-1) is preferable, and a cation represented by any of Formulae (ca-1-1) to (ca-1-46) is more preferable.

From the viewpoints of high elasticity of the resin film and ease of forming a fine structure without residues, it is preferable that the component (I) be a cationic polymerization initiator that generates an acid having a pKa (acid dissociation constant) of −5 or less upon exposure. It becomes possible to obtain high sensitivity upon exposure by using a cationic polymerization initiator that generates an acid having a pKa of preferably −6 or less and more preferably −8 or less. The lower limit of the pKa of the acid generated from the component (I) is preferably −15 or greater. The sensitivity is likely to be increased by using a cationic polymerization initiator that generates an acid having a pKa in the above-described suitable range.

Here, "pKa (acid dissociation constant)" is typically used as an index showing the acid strength of a target substance. Further, the pKa in the present specification is a value obtained under a temperature condition of 25° C. Further, the pKa value can be acquired by performing measurement according to a known technique. In addition, calculated values obtained by using known software such as "ACD/Labs" (trade name, manufactured by Advanced Chemistry Development Inc.) can be used.

Specific suitable examples of the component (I) are shown below.

(I1-1)

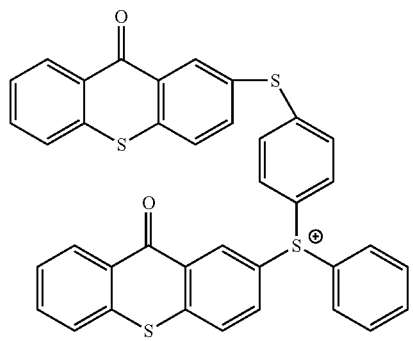

(I1-2)

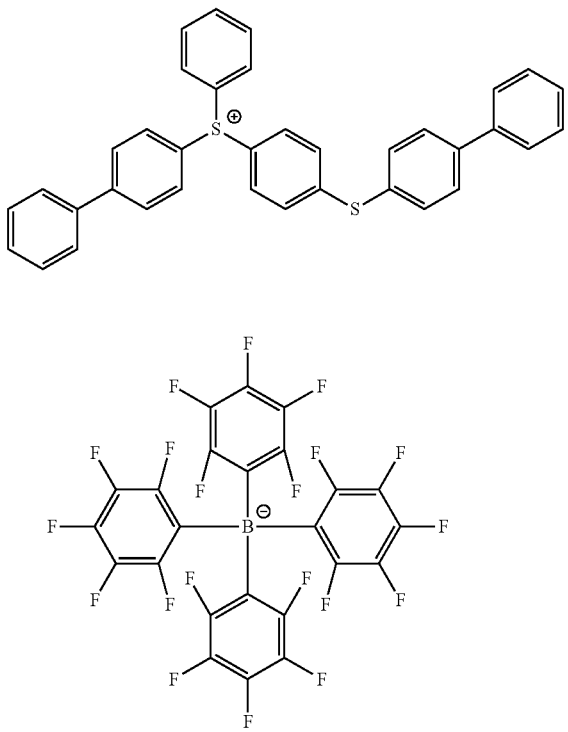

(I1-3)

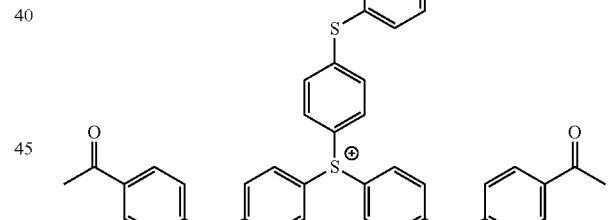

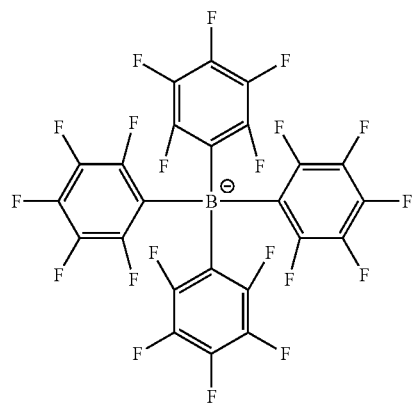

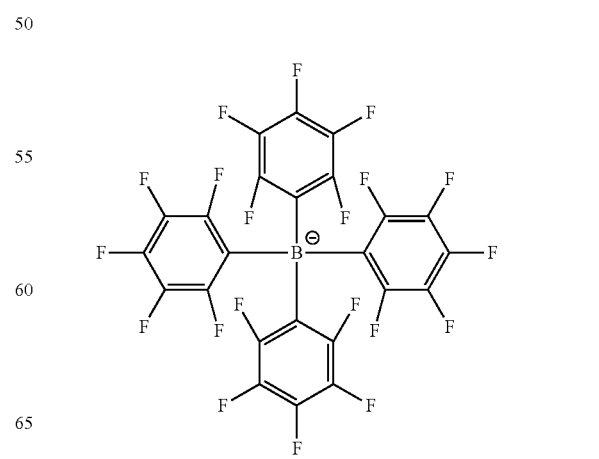

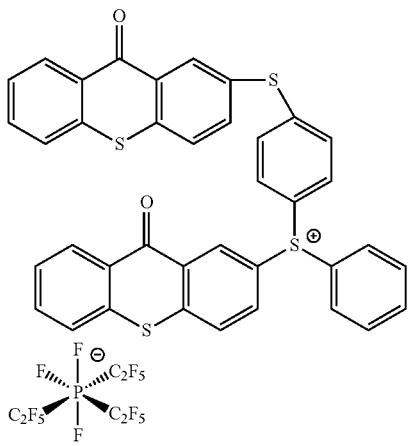

(I2-1)

The component (I) may be used alone or in a combination of two or more kinds thereof.

The content of the component (I) is preferably in a range of 1.2 to 6.0 parts by mass, more preferably in a range of 1.3 to 4.8 parts by mass, and still more preferably in a range of 1.4 to 3.6 parts by mass with respect to 100 parts by mass of the component (A).

In a case where the content of the component (A) is greater than or equal to the lower limit of the above-described preferable range, sufficient sensitivity is obtained, and lithography characteristics of the pattern are further improved. In addition, the hardness of the cured film is further increased. Further, in a case where the content of the component (A) is lower than or equal to the upper limit of the above-described preferable range, the sensitivity is appropriately controlled, and a pattern having an excellent shape is easily obtained.

Further, the content of the component (I) is preferably in a range of 1 to 5 parts by mass, more preferably in a range of 1.1 to 4 parts by mass, and still more preferably in a range of 1.2 to 3 parts by mass with respect to 100 parts by mass which is the total amount of the component (A) and the component (M).

In a case where the content of the component (I) is in the above-described preferable range, the hardness of the cured film is further improved, and a pattern having an excellent shape and high resolution is easily formed.

The content of the component (A) is preferably in a range of 70% to 90% by mass, more preferably in a range of 70% to 85% by mass, and still more preferably in a range of 75% to 85% by mass with respect to the total content of the component (A), the component (I), and the component (M) in the photosensitive composition of the present embodiment.

In a case where the content of the component (A) is in the above-described preferable range, the sensitivity is further increased, and a pattern having an excellent shape and high resolution is easily obtained.

<Other Components>

The photosensitive composition of the present embodiment may contain components other than the component (A), the component (I), and the component (M) as necessary.

As desired, other miscible additives such as additive resins, dissolution inhibitors, basic compounds, plasticizers, stabilizers, colorants, and halation preventing agents used to improve the performance of the film can be added to the photosensitive composition of the embodiment as appropriate.

<<Silane Coupling Agent>>

The photosensitive composition of the embodiment may further contain an adhesion assistant in order to improve the adhesiveness to the support. As this adhesion assistant, a silane coupling agent is preferable.

Examples of the silane coupling agent include silane coupling agents having reactive substituents such as a carboxy group, a methacryloyl group, an isocyanate group, and an epoxy group. Specific examples thereof include trimethoxysilylbenzoic acid, γ-methacryloxypropyltrimethoxysilane, vinyltriacetoxysilane, vinyltrimethoxysilane, γ-glycidoxypropyltrimethoxysilane, and β-(3,4-epoxycyclohexyl)ethyltrimethoxysilane.

The silane coupling agent may be used alone or in a combination of two or more kinds thereof.

The content of the silane coupling agent is preferably in a range of 2.5 to 20 parts by mass, more preferably in a range of 3 to 15 parts by mass, and still more preferably in a range of 3 to 10 parts by mass with respect to 100 parts by mass of the component (A).

In a case where the content of the silane coupling agent is in the above-described preferable range, the hardness of the cured film is further increased. In addition, the adhesiveness between the cured film and the support is further improved.

<<Cationic Polymerization Initiator (I0)>>

The photosensitive composition of the embodiment may contain a cationic polymerization initiator (hereinafter, referred to as a component (I0)) that does not correspond to the component (I).

By using a combination with the component (I0), the sensitivity during pattern formation does not become extremely high and a pattern having high resolution can be formed.

As the component (I0), a cationic polymerization initiator that generates an acid with a pKa of preferably −3 or greater, more preferably 0 or greater, and still more preferably 1 or greater is exemplified. Among the examples, an onium salt compound that does not have a halogen atom in the anion moiety thereof is preferable. By using the compound (I0) that does not have a halogen atom in the anion moiety thereof, the amount of gas to be generated (degassing) is more likely to be reduced. The upper limit of the pKa of the acid generated from the compound (I0) is preferably 5 or less.

As the component (I0), one or more compounds selected from the group consisting of a compound represented by Formula (b1-1) (hereinafter, referred to as a "component (b1-1)") and a compound represented by Formula (b1-2) (hereinafter, referred to as a "component (b1-2)") are preferable.

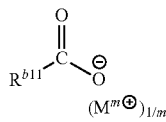

(b1-1)

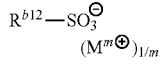

(b1-2)

[In the formulae, $R^{b11}$ and $R^{b12}$ represent a cyclic group which may have a substituent other than a halogen atom, a cyclic alkyl group which may have a substituent other than a halogen atom, or a cyclic alkenyl group which may have a substituent other than a halogen atom. m represents an integer of 1 or greater, and $M^{m+}$'s each independently represent an m-valent organic cation.]

{Component (b1-1)}
Anion Moiety

In Formula (b1-1), $R^{b11}$ represents a cyclic group which may have a substituent other than a halogen atom, a cyclic alkyl group which may have a substituent other than a halogen atom, or a cyclic alkenyl group which may have a substituent other than a halogen atom, and examples thereof include those that do not have substituents and those having substituents other than halogen atoms, among the cyclic group, the cyclic alkyl group, and the cyclic alkenyl group in the description of $R'^{201}$ above.

The expression "may have a substituent other than a halogen atom" here excludes not only a case of having a substituent formed of only a halogen atom but also a case of having a substituent having even one halogen atom (for example, a case where the substituent is a fluorinated alkyl group).

Among these, it is preferable that $R^{b11}$ represent an aromatic hydrocarbon group which may have a substituent other than a halogen atom, an aliphatic cyclic group which may have a substituent other than a halogen atom, and a chain alkyl group which may have a substituent other than a halogen atom. Examples of the substituents which may be included in these groups include a hydroxyl group, an oxo group, an alkyl group, an aryl group, a lactone-containing cyclic group, an ether bond, an ester bond, and a combination of these.

In a case where an ether bond or an ester bond is included as a substituent, the substituent may be bonded via an alkylene group, and a linking group represented by any of Formulae (y-a1-1) to (y-a1-7) is preferable as the substituent in this case.

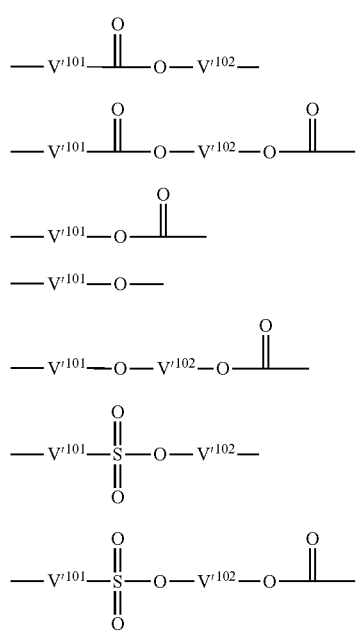

[In the formulae, $V'''^{101}$ represents a single bond or an alkylene group having 1 to 5 carbon atoms, and $V'^{102}$ represents a divalent saturated hydrocarbon group having 1 to 30 carbon atoms.]

As the divalent saturated hydrocarbon group represented by $V'^{102}$, an alkylene group having 1 to 30 carbon atoms is preferable, an alkylene group having 1 to 10 carbon atoms is more preferable, and an alkylene group having 1 to 5 carbon atoms is still more preferable.

The alkylene group of $V'^{101}$ and $V'^{102}$ may be a linear alkylene group or branched alkylene group, and a linear alkylene group is preferable.

Specific examples of the alkylene group of $V'^{101}$ and $V'^{102}$ include a methylene group [—$CH_2$—]; an alkylmethylene group such as —$CH(CH_3)$—, —$CH(CH_2CH_3)$—, —$C(CH_3)_2$—, —$C(CH_3)(CH_2CH_3)$—, —$C(CH_3)(CH_2CH_3)_2$—; an ethylene group [—$CH_2CH_2$—]; an alkylethylene group such as —$CH(CH_3)CH_2$—, —$CH(CH_3)CH(CH_3)$—, —$C(CH_3)_2CH_2$—, or —$CH(CH_2CH_3)CH_2$—; a trimethylene group (n-propylene group) [—$CH_2CH_2CH_2$—]; an alkyltrimethylene group such as —$CH(CH_3)CH_2CH_2$— or —$CH_2CH(CH_3)CH_2$—; a tetramethylene group [—$CH_2CH_2CH_2CH_2$—]; an alkyltetramethylene group such as —$CH(CH_3)CH_2CH_2CH_2$— or —$CH_2CH(CH_3)CH_2CH_2$—; and a pentamethylene group [—$CH_2CH_2CH_2CH_2CH_2$—].

Further, some methylene groups in the alkylene group of $V'^{101}$ or $V'^{102}$ may be substituted with a divalent aliphatic cyclic group having 5 to 10 carbon atoms. As the aliphatic cyclic group, a divalent group formed by further removing one hydrogen atom from a cyclic aliphatic hydrocarbon group of $R'^{201}$ (a monocyclic alicyclic hydrocarbon group or a polycyclic alicyclic hydrocarbon group) is preferable, and a cyclohexylene group, a 1,5-adamantylene group, or a 2,6-adamantylene group is more preferable.

As the aromatic hydrocarbon group, a phenyl group or a naphthyl group is more preferable.

As the aliphatic cyclic group, a group formed by removing one or more hydrogen atoms from a polycycloalkane such as adamantane, norbornane, isobornane, tricyclodecane, or tetracyclododecane is more preferable.

The number of carbon atoms of the chain alkyl group is preferably in a range of 1 to 10, and specific examples thereof include a linear alkyl group such as a methyl group, an ethyl group, a propyl group, a butyl group, a pentyl group, a hexyl group, a heptyl group, an octyl group, a nonyl group, or a decyl group; and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, or a 4-methylpentyl group.

It is preferable that $R^{b11}$ represent a cyclic group which may have a substituent other than a halogen atom.

Specific preferred examples of the anion moiety of the component (b1-1) are shown below.

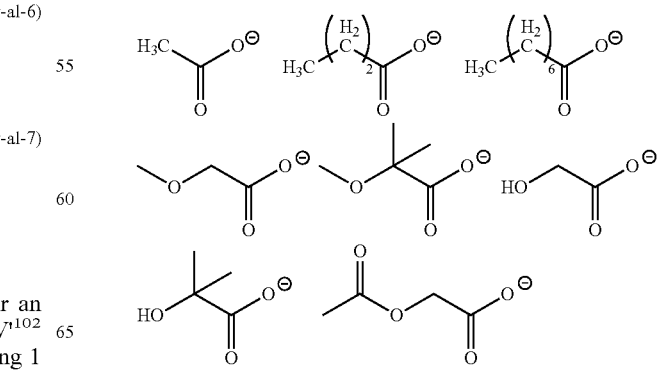

-continued

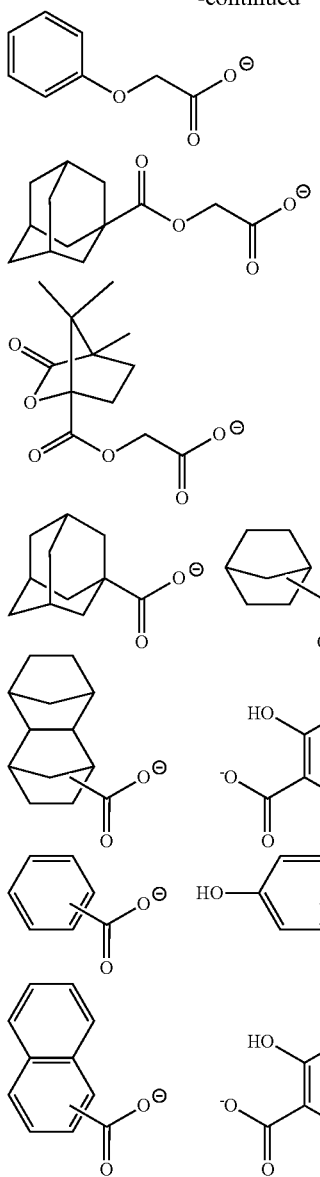

Cation Moiety

In Formula (b1-1), $M^{m+}$ represents an m-valent organic cation. Suitable examples of the organic cation of $M^{m+}$ are the same as the cations represented by Formulae (ca-1) to (ca-5). Among these, a cation represented by the above-described Formulae (ca-1) is more preferable. In addition, a sulfonium cation in which at least one of $R^{201}$, $R^{202}$, and $R^{203}$ in Formula (ca-1) represents an organic group (such as an aryl group, a heteroaryl group, an alkyl group, or an alkenyl group) which may have a substituent and has 16 or more carbon atoms is particularly preferable from the viewpoint of improving the resolution and roughness characteristics.

Examples of the substituent which may be included in the organic group include, as described above, an alkyl group, a halogen atom, a halogenated alkyl group, a carbonyl group, a cyano group, an amino group, an oxo group (=O), an aryl group, and a group represented by any of Formulae (ca-r-1) to (ca-r-10).

The number of carbon atoms in the organic group (such as an aryl group, a heteroaryl group, an alkyl group, or an alkenyl group) is preferably in a range of 16 to 25, more preferably in a range of 16 to 20, and particularly preferably in a range of 16 to 18, and suitable examples of the organic cation of $M^{m+}$ include cations represented by Formulae (ca-1-25), (ca-1-26), (ca-1-28) to (ca-1-36), (ca-1-38), and (ca-1-46).

The component (b1-1) may be used alone or in a combination of two or more kinds thereof.

{Component (b1-2)}

Anion Moiety

In Formula (b1-2), $R^{b12}$ represents a cyclic group which may have a substituent other than a halogen atom, a cyclic alkyl group which may have a substituent other than a halogen atom, or a cyclic alkenyl group which may have a substituent other than a halogen atom, and examples thereof include those that do not have substituents and those having substituents other than halogen atoms, among the cyclic group, the cyclic alkyl group, and the cyclic alkenyl group in the description of $R^{t201}$ above.

It is preferable that $R^{b12}$ represent a cyclic alkyl group which may have a substituent other than a halogen atom or an aliphatic cyclic group which may have a substituent other than a halogen atom.

The number of carbon atoms of the cyclic alkyl group is preferably in a range of 1 to 10 and more preferably in a range of 3 to 10. As the aliphatic cyclic group, a group (which may have a substituent other than a halogen atom) formed by removing one or more hydrogen atoms from adamantane, norbornane, isobornane, tricyclodecane, or tetracyclododecane; or a group formed by removing one or more hydrogen atoms from camphor is more preferable.

The hydrocarbon group of $R^{b12}$ may have a substituent other than a halogen atom. Examples of the substituent are the same as the substituents other than halogen atoms which may be included in the hydrocarbon group (such as an aromatic hydrocarbon group, an aliphatic cyclic group, or a chain alkyl group) of $R^{b11}$ in Formula (b1-1).

Specific preferred examples of the anion moiety of the component (b1-2) are shown below.

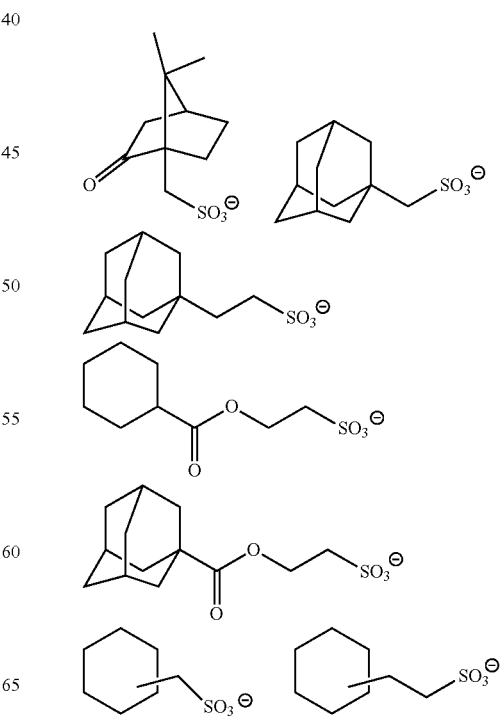

Cation Moiety

In Formula (b1-2), $M^{m+}$ represents an m-valent organic cation and has the same definition as that for $M^{m+}$ in Formula (b1-1). Among these, suitable examples of the organic cation of $M^{m+}$ include cations represented by Formulae (ca-1-25), (ca-1-26), (ca-1-28) to (ca-1-36), (ca-1-38), and (ca-1-46).

The component (b1-2) may be used alone or in a combination of two or more kinds thereof.

The component (I0) may be used alone or in a combination of two or more kinds thereof.

The content of the component (I0) is preferably in a range of 0.001 to 1 parts by mass, more preferably in a range of 0.005 to 1 parts by mass, and still more preferably in a range of 0.01 to 0.1 parts by mass with respect to 100 parts by mass of the component (A).

In a case where the content of the component (I0) is in the above-described range, a pattern having high resolution is easily formed.

<<Sensitizer Component>>

The photosensitive composition of the embodiment may further contain a sensitizer component.

The sensitizer component is not particularly limited as long as the component absorbs energy upon exposure and is capable of transferring the energy to other substances.

Specific examples of the sensitizer component include known photosensitizers, for example, a benzophenone-based photosensitizer such as benzophenone or p,p-tetramethyldiaminobenzophenone, a carbazole-based photosensitizer, an acetophene-based photosensitizer, a naphthalene-based photosensitizer such as 1,5-dihydroxynaphthalene, a phenol-based photosensitizer, an anthracene-based photosensitizer such as 9-ethoxyanthracene, biacetyl, eosin, rose bengal, pyrene, phenothiazine, and anthrone.

The sensitizer component may be used alone or in a combination of two or more kinds thereof.

The content of the sensitizer component is preferably in a range of 0.1 to 15 parts by mass, more preferably in a range of 0.3 to 10 parts by mass, and still more preferably in a range of 0.5 to 5 parts by mass with respect to 100 parts by mass of the component (A).

In a case where the content of the sensitizer component is in the above-described preferable range, the sensitivity and the resolution are further improved.

The photosensitive composition of the embodiment can be produced by dissolving or dispersing a photosensitive material in a solvent (hereinafter, also referred to as a "component (S)").

Examples of the component (S) include lactones such as γ-butyrolactone; ketones such as acetone, methyl ethyl ketone (MEK), cyclohexanone, methyl-n-pentyl ketone, methyl isopentyl ketone, and 2-heptanone; polyhydric alcohols such as ethylene glycol, diethylene glycol, propylene glycol, and dipropylene glycol; compounds having an ester bond such as ethylene glycol monoacetate, diethylene glycol monoacetate, propylene glycol monoacetate, and dipropylene glycol monoacetate; polyhydric alcohol derivatives such as compounds having an ether bond, for example, a monoalkylether such as monomethylether, monoethylether, monopropylether, or monobutylether or a monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene, and mesitylene; and dimethylsulfoxide (DMSO).

The component (S) may be used alone or in the form of a mixed solvent of two or more kinds thereof.

The amount of the component (S) to be used is not particularly limited and is appropriately set so as to have a concentration suitable for application to a substrate or the like depending on the thickness of a coating film.

The content of the component (S) in the photosensitive composition is preferably in a range of 1% to 25% by mass and more preferably in a range of 5% to 20% by mass with respect to the total amount (100% by mass) of the photosensitive composition.

As described above, in a case where the negative photosensitive resin composition according to the present embodiment contains a metal oxide (M) in addition to the epoxy group-containing resin (A) and the cationic polymerization initiator (I), particularly, a cured film with improved hardness is obtained.

In addition, sufficient sensitivity is obtained, the amount of residues is decreased, and thus a pattern having an excellent shape and high resolution can be formed by employing, as the component (I), one or more selected from the group consisting of a compound represented by Formula (I1) (component (I1)) and a compound represented by Formula (I2) (component (I2)).

Further, an antimony compound of the related art used as a cationic polymerization initiator is designated as a deleterious substance. On the other hand, both of the component (I1) and the component (I2) are not designated as deleterious substances, and the environmental load thereof is small and the handleability thereof is excellent.

(Photosensitive Resist Film)

The photosensitive resist film of the present embodiment is obtained by laminating a base film, a photosensitive resin film formed by using the negative type photosensitive resin composition described above, and a cover film in that order.

The photosensitive resist film of the present embodiment can be produced, for example, by coating the base film with the negative photosensitive resin composition of the embodiment described above, drying the composition to form a photosensitive resin film, and laminating a cover film on the photosensitive resin film.

The base film may be coated with the negative type photosensitive resin composition according to an appropriate method using a blade coater, a lip coater, a comma coater, or a film coater.

The thickness of the photosensitive resin film is preferably 100 μm or less and more preferably in a range of 5 to 50 μm.

As the base film, known films such as a thermoplastic resin film are used. Examples of this thermoplastic resin include polyesters such as polyethylene terephthalate. The thickness of the base film is preferably in a range of 2 to 150 μm.

As the cover film, known films such as a polyethylene film and a polypropylene film are used. As the cover film, a film whose adhesive force to the photosensitive resin film is smaller than that of the base film is preferable. The thickness of the cover film is preferably in a range of 2 to 150 μm, more preferably in a range of 2 to 100 μm, and still more preferably in a range of 5 to 50 μm.

The base film and the cover film may be formed of the same film material or different film materials.

(Pattern Forming Method)

A pattern forming method of the present embodiment includes a step of forming a photosensitive resin film on a support (hereinafter, referred to as a "film formation step") using the negative type photosensitive resin composition or the photosensitive resist film of the embodiment described above; a step of exposing the photosensitive resin film (hereinafter, referred to as an "exposure step"); and a step of developing the exposed photosensitive resin film to form a negative type pattern (hereinafter, referred to as a "development step").

The pattern forming method of the present embodiment can be performed in the following manner.

[Film Formation Step]

First, a photosensitive resin film is formed by coating the support with the negative type photosensitive resin composition of the embodiment using a known method such as a spin coating method, a roll coating method, or a screen printing method and performing a bake (post apply bake (PAB)) treatment under a temperature condition of, for example, 50° C. to 150° C. for 2 to 60 minutes.

In the film formation step, a photosensitive resin film may be formed on the support by attaching the photosensitive resist film to the support. The cover film may be peeled off before the photosensitive resist film is attached to the support. In this manner, the surface of the exposed photosensitive resin film is brought into contact with the support, and the photosensitive resist film is attached to the support. During the attachment, the support or the film may be heated or pressed (laminated) as necessary. After the photosensitive resist film is attached to the support, the base film may be peeled off before or after the exposure step described below.

The support is not particularly limited and a known support of the related art can be used. For example, substrates for electronic components, and such substrates having predetermined wiring patterns formed thereon can be used. More specific examples thereof include a metal substrate such as a silicon wafer, copper, chromium, iron, or aluminum; a glass substrate; and a resin film such as polyethylene terephthalate, polyethylene naphthalate, polypropylene, or polyethylene. As the materials for the wiring pattern, copper, aluminum, nickel, and gold can be used.

Further, as the support, any one of the above-described substrates provided with an inorganic and/or organic film may be used. Examples of the inorganic film include an inorganic antireflection film (inorganic BARC). Examples of the organic film include organic films such as an organic antireflection film (organic BARC) and a lower layer organic film according to a multilayer resist method.

The film thickness of the photosensitive resin film to be formed using the negative type photosensitive resin composition or the photosensitive resist film is not particularly limited, but is preferably in a range of 10 to 100 μm. Even in a case where a thick film is formed using the negative type photosensitive resin composition of the embodiment, excellent characteristics are obtained.

[Exposure Step]

Next, the formed photosensitive resin film is exposed through a mask having a predetermined pattern formed thereon (mask pattern) using a known exposure device or selectively exposed through drawing or the like by performing direct irradiation with electron beams without using a mask pattern therebetween. In addition, a bake (post exposure bake (PEB)) treatment is performed under a temperature condition of 80° C. to 150° C. for 40 to 600 seconds and preferably 60 to 300 seconds.

The wavelength used in the exposure is not particularly limited, and the exposure is performed by selectively radiating (exposing to) radiation, for example, ultraviolet rays having a wavelength of 300 to 500 nm, an i-line (wavelength of 365 nm), or visible light rays. As sources of such radiation, a low pressure mercury lamp, a high pressure mercury lamp, an ultra-high pressure mercury lamp, a metal halide lamp, and an argon gas laser can be used.

Here, the radiation indicates ultraviolet rays, visible light rays, far ultraviolet rays, X rays, electron beams, or the like. The radiation dose varies depending on the type of each component in the composition, the blending amount thereof, the film thickness of a coating film, and the like. For example, in a case where an ultra-high pressure mercury lamp is used, the radiation does thereof is in a range of 100 to 2000 mJ/cm$^2$.

The photosensitive resin film may be exposed through typical exposure (dry exposure) performed in air or an inert gas such as nitrogen or through liquid immersion exposure (liquid immersion lithography).

The photosensitive resin film after the exposure step is highly transparent, and the haze value at the time of irradiation with an i-line (wavelength of 365 nm) is preferably 3% or less and more preferably in a range of 1.0% to 2.7%.

As described above, the photosensitive resin film formed using the negative photosensitive resin composition or the photosensitive resist film according to the embodiment is highly transparent. Therefore, the optical transparency is increased during the exposure in pattern formation so that a negative type pattern with excellent lithography characteristics is likely to be obtained.

The haze value of the photosensitive resin film after the exposure step is measured using a method in conformity with JIS K 7136 (2000).

[Development Step]

Next, the exposed photosensitive resin film is subjected to a development treatment. After the development treatment, it is preferable that a rinse treatment be performed. As necessary, a bake treatment (post bake) may be performed.

By performing the above-described film forming step, exposure step, and development step, a pattern can be formed.

The developing solution used in the development treatment may be an alkali aqueous solution or an organic developing solution containing an organic solvent.

As the alkali developing solution, a 0.1 to 10 mass % tetramethylammonium hydroxide (TMAH) aqueous solution can be exemplified.

As the organic solvent contained in the organic developing solution, a solvent which is capable of dissolving the component (A) (the component (A) which has not been exposed yet) may be used and can be appropriately selected from known organic solvents. Specific examples of the organic solvent include polar solvents such as ketone solvents, ester solvents, alcohol solvents, nitrile solvents, amide solvents, and ether solvents; and hydrocarbon solvents.

Examples of the ketone solvents include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonylalcohol, acetylcarbinol, acetophenone, methyl naphthyl ketone, isophorone, propylenecarbonate, γ-butyrolactone and methyl amyl ketone (2-heptanone). Among these examples, as a ketone solvent, methyl amyl ketone (2-heptanone) is preferable.

Examples of the ester solvents include methyl acetate, butyl acetate, ethyl acetate, isopropyl acetate, amyl acetate, isoamyl acetate, ethyl methoxyacetate, ethyl ethoxyacetate, propylene glycol monomethyl ether acetate (PGMEA), ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Among these examples, as an ester solvent, butyl acetate or PGMEA is preferable.

Examples of the nitrile solvents include acetonitrile, propionitrile, valeronitrile, and butyronitrile.

Known additives can be blended with the organic developing solution as necessary. Examples of the additive include surfactants. The surfactant is not particularly limited, and for example, an ionic or non-ionic fluorine-based and/or silicon-based surfactant can be used.

As the surfactant, a non-ionic surfactant is preferable, and a non-ionic fluorine-based surfactant or a non-ionic silicon-based surfactant is more preferable.

In a case where a surfactant is blended, the amount thereof to be blended is typically in a range of 0.001% to 5% by mass, preferably in a range of 0.005% to 2% by mass, and more preferably in a range of 0.01% to 0.5% by mass with respect to the total amount of the organic developing solution.

The developing treatment can be performed by a known developing method. Examples thereof include a method of immersing a support in a developing solution for a predetermined time (a dip method), a method of stacking up a developing solution on the surface of a support using the surface tension and maintaining the state for a predetermined time (a puddle method), a method of spraying a developing solution to the surface of a support (a spray method), and a method of continuously ejecting a developing solution from a developing solution ejecting nozzle onto a support rotating at a constant speed while scanning the developing solution ejecting nozzle at a constant rate (a dynamic dispense method).

The rinse treatment (washing treatment) performed using a rinse liquid can be carried out according to a known rinse method. Examples of the rinse treatment method include a method of continuously ejecting a rinse liquid onto a support rotating at a constant speed (a rotary coating method), a method of immersing a support in a rinse liquid for a predetermined time (a dip method), and a method of spraying a rinse liquid to the surface of a support (a spray method).

In the rinse treatment, water rinse using pure water is preferable in a case of an alkali developing solution. Further, it is preferable to use a rinsing liquid containing an organic solvent in a case of an organic developing solution.

According to the pattern forming method of the embodiment described above, since the negative type photosensitive resin composition according to the first embodiment is used, the sensitivity is improved, and the amount of residues is decreased so that a pattern having an excellent shape and high resolution can be formed.

(Cured Film)

A cured film of the present embodiment is obtained by curing the negative type photosensitive resin composition according to the embodiment described above. The tensile elasticity of the cured film according to the present embodiment is preferably 2.0 GPa or greater and more preferably 2.2 GPa or greater under a temperature condition of 175° C. The tensile elasticity of the cured film is measured under a temperature condition of 175° C. using a dynamic viscoelasticity measuring device.

(Method of Producing Cured Film)

A method of producing the cured film according to the present embodiment includes a step (i) of forming a photosensitive resin film on a support using the negative type photosensitive resin composition or the photosensitive resist film according to the embodiment described above; and a step (ii) of curing the photosensitive resin film to obtain a cured film.

The operation of the step (i) can be performed in the same manner as in the "film formation step" described above. The bake treatment can be performed in a temperature range of 50° C. to 100° C. for 0.5 to 30 minutes.

The curing treatment in the step (ii) can be performed in a temperature range of 100° C. to 250° C. for 0.5 to 2 hours.

The method of producing the cured film according to the embodiment may include steps other than the step (i) and the step (ii). For example, the above-described "exposure step" may be performed between the step (i) and the step (ii), or a cured film can be obtained by performing selective exposure on the photosensitive resin film formed in the step (i) and curing the photosensitive resin film (pre-cured film) to which a bake (PEB) treatment has been applied as necessary.

According to the method of producing the cured film according to the embodiment described above, a cured film with improved hardness is produced.

EXAMPLES

Hereinafter, the present invention will be described in more detail with reference to examples, but the present invention is not limited to the following examples.

<Preparation of Photosensitive Resin Composition>

Examples 1 to 16 and Comparative Examples 1 to 6

Respective components listed in Tables 1 to 3 were mixed and dissolved, and the solution was filtered using a PTFE filter (a pore diameter of 1 μm, manufactured by Pall Corporation) to prepare each negative type photosensitive resin composition (a MEK solution having a solid content of 80% to 85% by mass) of each example.

TABLE 1

|  | Component (A) | | | | Component (I) | | | |
|---|---|---|---|---|---|---|---|---|
|  | Component (A1) | Compound (m1) | Compound (m2) | Component (M) | Component (I1) | Component (I2) | Component (I3) | Component (S) |
| Example 1 | (A) - 1 [100] | — | — | (M) - 1 [22] | (I1) - 1 [1.56] | — | — | (S) - 1 [29] |
| Example 2 | (A) - 1 [100] | — | — | (M) - 1 [22] | (I1) - 2 [3.75] | — | — | (S) - 1 [28] |
| Example 3 | (A) - 1 [100] | — | — | (M) - 1 [22] | (I1) - 3 [3.13] | — | — | (S) - 1 [28] |
| Example 4 | (A) - 1 [100] | — | — | (M) - 1 [22] | — | (I2) - 1 [3.13] | — | (S) - 1 [28] |
| Example 5 | (A) - 1 [100] | — | — | (M) - 1 [22] | (I1) - 2 [1.69] | (I2) - 1 [0.56] | — | (S) - 1 [28] |
| Example 6 | (A) - 1 [100] | — | — | (M) - 1 [22] | (I1) - 2 [1.41] | (I2) - 1 [0.47] | — | (S) - 1 [29] |
| Example 7 | (A) - 1 [100] | — | — | (M) - 1 [22] | (I1) - 3 [1.87] | (I2) - 1 [0.63] | — | (S) - 1 [29] |
| Comparative Example 1 | (A) - 1 [100] | — | — | — | (I1) - 1 [1.8] | — | — | (S) - 1 [24] |
| Comparative Example 2 | (A) - 1 [100] | — | — | — | (I1) - 1 [1.0] | — | — | (S) - 1 [24] |
| Comparative Example 3 | (A) - 1 [100] | — | — | (M) - 1 [22] | — | — | (I3) - 1 [3.75] | (S) - 1 [28] |

TABLE 2

|  | Component (A) | | | | Component (I) | | Silane coupling agent | Component (S) |
|---|---|---|---|---|---|---|---|---|
|  | Component (A1) | Compound (m1) | Compound (m2) | Component (M) | Component (I1) | Component (I2) |  |  |
| Example 8 | (A) - 1 [100] | — | — | (M) - 1 [23] | (I1) - 1 [1.64] | — | (C) - 1 [5.26] | (S) - 1 [30] |
| Example 9 | (A) - 1 [90] | (A) - 2 [5] | (A) - 3 [5] | (M) - 1 [22] | (I1) - 1 [1.56] | — | — | (S) - 1 [30] |
| Example 10 | (A) - 1 [90] | (A) - 2 [5] | (A) - 3 [5] | (M) - 1 [22] | (I1) - 2 [3.75] | — | — | (S) - 1 [28] |
| Example 11 | (A) - 1 [90] | (A) - 2 [5] | (A) - 3 [5] | (M) - 1 [22] | — | (I2) - 1 [2.51] | — | (S) - 1 [28] |
| Example 12 | (A) - 1 [90] | (A) - 2 [5] | (A) - 3 [5] | (M) - 1 [22] | (I1) - 2 [1.68] | (I2) - 1 [0.56] | — | (S) - 1 [29] |
| Example 13 | (A) - 1 [90] | (A) - 2 [5] | (A) - 3 [5] | (M) - 1 [22] | (I1) - 3 [1.87] | (I2) - 1 [0.63] | — | (S) - 1 [29] |
| Example 14 | (A) - 1 [95] | — | (A) - 3 [5] | (M) - 1 [22] | (I1) - 2 [1.68] | (I2) - 1 [0.56] | — | (S) - 1 [28] |
| Comparative Example 4 | (A) - 1 [90] | (A) - 2 [5] | (A) - 3 [5] | — | (I1) - 1 [1.8] | — | — | (S) - 1 [24] |
| Comparative Example 5 | (A) - 1 [90] | (A) - 2 [5] | (A) - 3 [5] | — | (I1) - 1 [1.0] | — | — | (S) - 1 [24] |
| Comparative Example 6 | (A) - 1 [90] | (A) - 2 [5] | (A) - 3 [5] | — | (I1) - 2 [1.87] | (I2) - 1 [0.63] | — | (S) - 1 [24] |

TABLE 3

| | Component (A) | | | Component (I) | | | |
|---|---|---|---|---|---|---|---|
| | Component (A1) | Compound (m1) | Compound (m2) | Component (M) | Component (I1) | Component (I2) | Component (S) |
| Example 15 | (A) - 1 [100] | — | — | (M) - 1 [30] | (I1) - 1 [1.68] | — | (S) - 1 [32] |
| Example 16 | (A) - 1 [100] | — | — | (M) - 1 [15] | (I1) - 1 [1.47] | — | (S) - 1 [23] |

The abbreviations in Tables 1 to 3 have the following meanings. The numerical values in parentheses are blending amounts (parts by mass, in terms of solid content) of each component.

(A)-1: epoxy group-containing resin represented by Formula (A11), trade name "JER157s70", manufactured by Mitsubishi Chemical Corporation

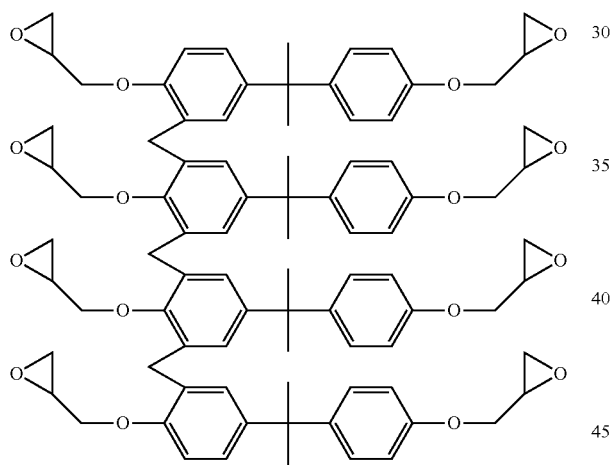

(A11)

(A)-2: compound represented by Chemical Formula (m1-1), trade name "CELLOXIDE 8000", manufactured by Daicel Corporation (A)-3: compound represented by Chemical Formula (m2-1), trade name "TEPIC-VL", manufactured by Nissan Chemical Industries, Ltd.

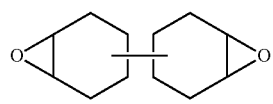

(m1-1)

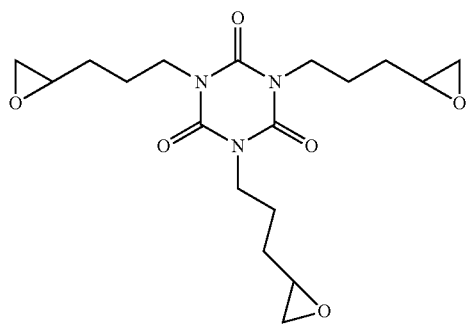

(m2-1)

(M)-1: silica component (a), trade name "MEK-EC-2130Y", manufactured by Nissan Chemical Industries, Ltd., primary particle diameter φ of 15 nm (volume average value), methyl ethyl ketone dispersion liquid having silica component concentration of 31% by mass (I1)-1: cationic polymerization initiator represented by Chemical Formula (I1-1), trade name "CPI-410B", manufactured by San-Apro Ltd.

(I1)-2: cationic polymerization initiator represented by Chemical Formula (I1-2), trade name "HS-1B", manufactured by San-Apro Ltd.

(I1)-3: cationic polymerization initiator represented by Chemical Formula (I1-2), trade name "PAG290", manufactured by BASF SE

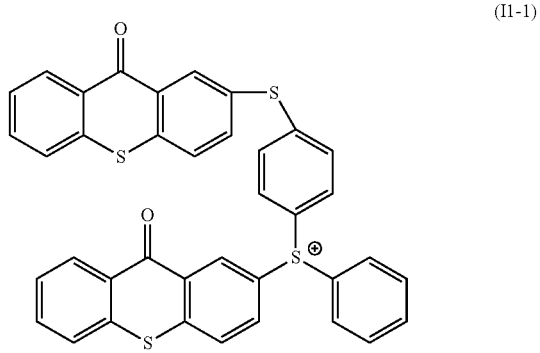

(I1-1)

-continued

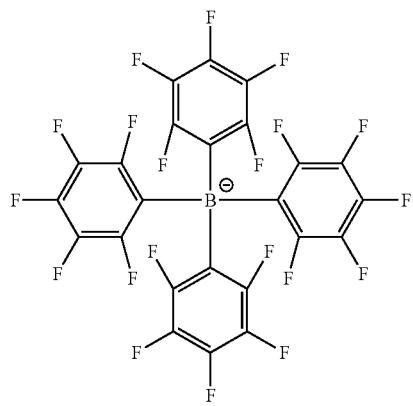

(I1-2)

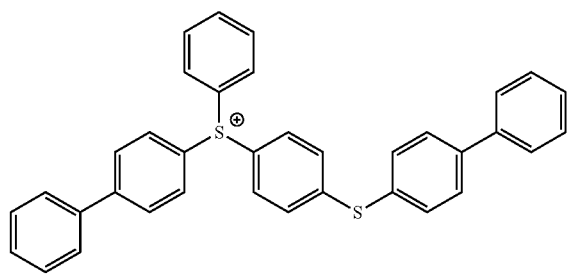

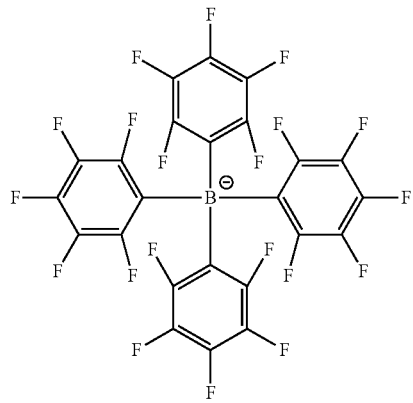

(I1-3)

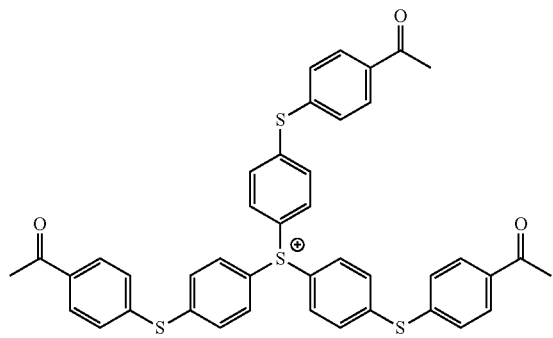

-continued

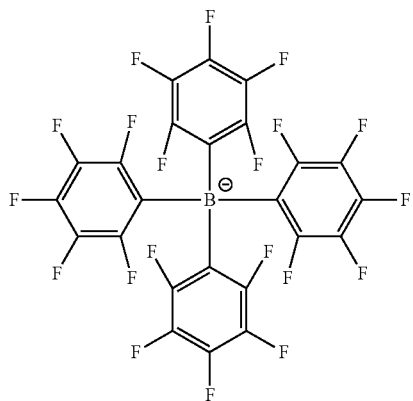

(I2)-1: cationic polymerization initiator represented by Chemical Formula (I2-1), trade name "CPI-410S", manufactured by San-Apro Ltd.

(I3)-1: cationic polymerization initiator represented by Chemical Formula (I3-1), trade name "HS-1CS", manufactured by San-Apro Ltd.

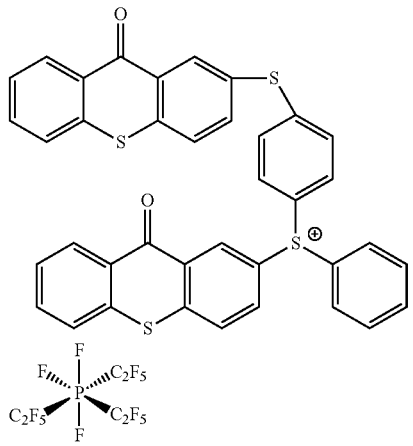

(I2-1)

(I3-1)

(C)-1: γ-glycidoxypropyltrimethoxysilane represented by Chemical Formula (C-1), trade name "OFS-6040", manufactured by Dow Corning Toray Co., Ltd.

(S)-1: methyl ethyl ketone (MEK)

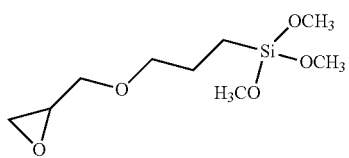
(C-1)

<Production of Photosensitive Resist Film>

A base film was coated with the photosensitive resin composition using an applicator, heated at a temperature of 50° C. for 3 minutes, and subjected to a bake treatment (PAB) at 70° C. for 3 minutes, thereby forming a photosensitive resin film having a thickness of 20 μm.

Next, a cover film was laminated on the photosensitive resin film under conditions of a temperature of 35° C. with a pressure of 0.3 MPa at 0.5 m/min, thereby obtaining a photosensitive resist film.

<Production of Cured Film>

Step (i):

The cover film on the photosensitive resin film in the photosensitive resist film obtained in the above-described manner was peeled off, and the exposed photosensitive resin film and a silicon wafer were laminated on each other under conditions of a temperature of 90° C. with a pressure of 0.3 MPa at 0.5 m/min.

Next, the base film in contact with the photosensitive resin film was peeled off, and the photosensitive resin film was irradiated with an i-line (wavelength of 365 nm) at a radiation dose of 300 mJ/cm². Thereafter, the film was exposed and heated on a hot plate at 90° C. for 5 minutes, thereby obtaining a pre-cured film.

Step (ii):

Thereafter, the obtained pre-cured film was heated at 200° C. for 1 hour and cured in a nitrogen atmosphere, thereby obtaining a target cured film.

[Evaluation of Hardness of Cured Film]

The hardness of the obtained target cured film was evaluated based on the tensile elasticity as an index. The tensile elasticity was measured in the following manner.

The obtained cured film was peeled off from the silicon wafer, and the tensile elasticity (E*/GPa) of the cured film at 175° C. was measured under the following measurement conditions using the following evaluation device. The results are listed in Table 4.

The hardness of the cured film increases as the tensile elasticity increases.

Evaluation device: Rheogel-E4000 (manufactured by UBM Co., Ltd.)

Measurement conditions: tensile mode, frequency of 1 MHz, distance between chucks: 10 mm

[Evaluation of Optical Characteristics]

The optical characteristics were evaluated based on the haze value of the obtained pre-cured film as an index.

The haze value was measured in conformity with JIS K 7136 (2000) in the measurement wavelength range using the following evaluation device according to the haze measurement method.

Evaluation device: UV3600 (manufactured by Shimadzu Corporation)

Measurement wavelength range: 300 to 800 nm

Haze measurement method: The total light transmittance and the diffuse transmittance at 365 nm were measured, and the haze value (clouding degree) was measured based on the following equation.

Haze (%)=diffuse transmittance/total light transmittance×100

<Pattern Forming Method>

Film Formation Step:

The cover film on the photosensitive resin film in the photosensitive resist film obtained in the above-described manner was peeled off, and the exposed photosensitive resin film and a silicon wafer were laminated on each other under conditions of a temperature of 90° C. with a pressure of 0.3 MPa at 0.5 m/min Exposure Step:

Next, the base film in contact with the photosensitive resin film was peeled off, and the photosensitive resin film was irradiated with an i-line (wavelength of 365 nm) at a radiation dose of 300 mJ/cm² through a negative mask having an opening pattern with a hole diameter of 10 μm. Thereafter, the film was exposed and heated on a hot plate at 90° C. for 5 minutes.

Development Step:

Next, the exposed silicon wafer was developed at 23° C. for 5 minutes using PGMEA, subjected to a rinse treatment, and dried, thereby forming a negative type pattern.

[Evaluation of Photolithography]

The fine structure of the formed negative type pattern was observed using a scanning electron microscope (manufactured by Hitachi High-Technologies Corporation, S-4300). Specifically, the lithography characteristics were evaluated by observing the presence or absence of residues in the negative type pattern and the cross-sectional shape of the opening pattern with a hole diameter of 10 μm based on the following evaluation criteria. The results are listed in Table 4.

Evaluation Criteria

A: Residues were not found and a rectangular pattern was obtained.

B: A tapered pattern was obtained.

TABLE 4

|  | Content of component (A) (% by mass)/total content of components (A), (I), and (M) | Content of component (I) (parts by mass)/100 parts by mass which is total amount of components (A) and (M) | Evaluation | | |
|---|---|---|---|---|---|
|  |  |  | Hardness of cured film Tensile elasticity E* (175° C.) | Optical characteristics Haze value (%) | Photolithography Lithography characteristics |
| Example 1 | 81.1 | 1.25 | 2.4 | 2.0 or less | A |
| Example 2 | 79.6 | 3.0 | 2.1 | 2.0 or less | A |
| Example 3 | 80.0 | 2.5 | 2.1 | 2.0 or less | A |
| Example 4 | 80.0 | 2.5 | 2.1 | 2.0 or less | A |

TABLE 4-continued

| | Content of component (A) (% by mass)/total content of components (A), (I), and (M) | Content of component (I) (parts by mass)/100 parts by mass which is total amount of components (A) and (M) | Evaluation | | |
|---|---|---|---|---|---|
| | | | Hardness of cured film Tensile elasticity E* (175° C.) | Optical characteristics Haze value (%) | Photolithography Lithography characteristics |
| Example 5 | 80.5 | 1.8 | 2.2 | 2.0 or less | A |
| Example 6 | 80.8 | 1.5 | 2.2 | 2.0 or less | A |
| Example 7 | 80.4 | 2.0 | 2.2 | 2.0 or less | A |
| Comparative Example 1 | 98.2 | 1.8 | <1.7 | 2.0 or less | B |
| Comparative Example 2 | 99.0 | 1.0 | <1.7 | 2.0 or less | A |
| Comparative Example 3 | 79.6 | 3.0 | Impossible to prepare cured film | Impossible to prepare cured film | Impossible to prepare cured film |
| Example 8 | 79.6 | 1.25 | 2.4 | 2.0 or less | A |
| Example 9 | 81.0 | 1.25 | 2.4 | 2.0 or less | A |
| Example 10 | 79.6 | 3.0 | 2.1 | 2.0 or less | A |
| Example 11 | 80.4 | 2.0 | 2.1 | 2.0 or less | A |
| Example 12 | 80.5 | 1.8 | 2.1 | 2.0 or less | A |
| Example 13 | 80.4 | 2.0 | 2.2 | 2.0 or less | A |
| Example 14 | 80.5 | 1.8 | 2.1 | 2.0 or less | A |
| Comparative Example 4 | 98.2 | 1.8 | <1.7 | 2.0 or less | B |
| Comparative Example 5 | 99.0 | 1.0 | <1.7 | 2.0 or less | A |
| Comparative Example 6 | 98.2 | 1.8 | <1.7 | 2.0 or less | B |
| Example 15 | 76.0 | 1.25 | 2.5 | 2.5 | A |
| Example 16 | 86.0 | 1.25 | 2.1 | 2.0 or less | A |

Based on the results listed in Table 4, it was found that the tensile elasticity of each cured film was high in a case of the resin compositions of Examples 1 to 16 to which the present invention was applied, compared to the resin compositions of Comparative Examples 1 to 6 which are outside the range of the present invention.

Further, it was found that a rectangular pattern was obtained without residues in a case where a pattern was formed using the resin compositions of Examples 1 to 16.

In other words, according to the present invention, it was confirmed that a cured film with improved hardness was able to be obtained and a pattern having an excellent shape was able to be obtained.

The invention claimed is:

1. A negative type photosensitive resin composition comprising:
an epoxy group-containing resin (A);
a metal oxide (M); and
a cationic polymerization initiator (I),
wherein the content of the epoxy group-containing resin (A) is in a range of 70% to 90% by mass with respect to the total content of the epoxy group-containing resin (A), the cationic polymerization initiator (I), and the metal oxide (M),
the metal oxide (M) consists of particles having a volume average particle diameter of 5 to 40 nm,
the content of the metal oxide (M) is in a range of 10 to 30 parts by mass with respect to 100 parts by mass of the epoxy group-containing resin (A), and
wherein the cationic polymerization initiator (I) contains one or more selected from the group consisting of a compound represented by Formula (I1) and a compound represented by Formula (I2):

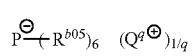
(I2)

wherein $R^{b01}$ to $R^{b04}$ each independently represents an aryl group which may have a substituent or a fluorine atom, $R^{b05}$ represents a fluorinated alkyl group which may have a substituent or a fluorine atom, a plurality of $R^{b05}$'s may be the same as or different from one another, q represents an integer of 1 or greater, and each $Q^{q+}$ independently represents a g-valent organic cation.

2. The negative type photosensitive resin composition according to claim 1, wherein a content of the cationic polymerization initiator (I) is in a range of 1 to 5 parts by mass with respect to 100 parts by mass which is a total amount of the epoxy group-containing resin (A) and the metal oxide (M).

3. The negative type photosensitive resin composition according to claim 1, wherein a content of the metal oxide (M) is in a range of 10 to 30 parts by mass with respect to 100 parts by mass of the epoxy group-containing resin (A).

4. The negative type photosensitive resin composition according to claim 1, wherein the epoxy group-containing resin (A) contains a resin represented by Formula (A1):

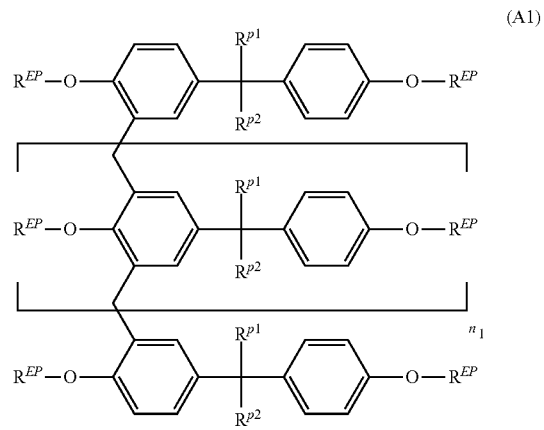
(A1)

wherein $R^{p1}$ and $R^{p2}$ each independently represents a hydrogen atom or an alkyl group having 1 to 5 carbon atoms, a plurality of $R^{p1}$'s may be the same as or different from one another, a plurality of $R^{p2}$'s may be the same as or different from one another, $n_1$ represents an integer of 1 to 5, $R^{EP}$ represents an epoxy group-containing group, and a plurality of $R^{EP}$'s may be the same as or different from one another.

5. The negative type photosensitive resin composition according to claim 1, further comprising a silane coupling agent.

6. The negative type photosensitive resin composition according to claim 1, wherein the epoxy group-containing resin (A) contains a compound having a partial structure represented by Formula (m1):

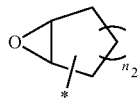

(m1)

wherein n2 represents an integer of 1 to 4, and the symbol "*" represents a bonding site.

7. The negative type photosensitive resin composition according to claim 1, wherein the epoxy group-containing resin (A) contains a compound represented by Formula (m2):

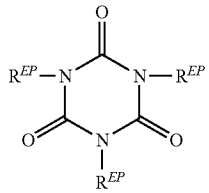

(m2)

wherein $R^{EP}$ represents an epoxy group-containing group, and a plurality of $R^{EP}$'s may be the same as or different from one another.

8. A photosensitive resist film which is obtained by laminating a base film, a photosensitive resin film formed using the negative type photosensitive resin composition according to claim 1, and a cover film in this order.

9. A pattern forming method comprising:
   forming a photosensitive resin film on a support using the negative type photosensitive resin composition according to claim 1;
   exposing the photosensitive resin film; and
   developing the exposed photosensitive resin film to form a negative type pattern.

10. A pattern forming method comprising:
    forming a photosensitive resin film on a support using the photosensitive resist film according to claim 8;
    exposing the photosensitive resin film; and
    developing the exposed photosensitive resin film to form a negative type pattern.

11. A cured film which is obtained by curing the negative type photosensitive resin composition according to claim 1.

12. A method of producing a cured film, comprising:
    forming a photosensitive resin film on a support using the negative type photosensitive resin composition according to claim 1; and
    curing the photosensitive resin film to obtain a cured film.

13. A method of producing a cured film, comprising:
    forming a photosensitive resin film on a support using the photosensitive resist film according to claim 8; and
    curing the photosensitive resin film to obtain a cured film.

* * * * *